United States Patent
Okazaki et al.

(10) Patent No.: US 7,636,253 B2
(45) Date of Patent: Dec. 22, 2009

(54) SEMICONDUCTOR DEVICE

(75) Inventors: Tsutomu Okazaki, Itami (JP); Daisuke Okada, Kunitachi (JP); Kyoya Nitta, Kokubunji (JP); Toshihiro Tanaka, Akiruno (JP); Akira Kato, Tachikawa (JP); Toshikazu Matsui, Kodaira (JP); Yasushi Ishii, Mito (JP); Digh Hisamoto, Kokubunji (JP); Kan Yasui, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/354,867

(22) Filed: Jan. 16, 2009

(65) Prior Publication Data

US 2009/0122609 A1 May 14, 2009

Related U.S. Application Data

(63) Continuation of application No. 11/797,164, filed on May 1, 2007, now Pat. No. 7,502,257, which is a continuation of application No. 11/198,191, filed on Aug. 8, 2005, now Pat. No. 7,245,531.

(30) Foreign Application Priority Data

Aug. 9, 2004 (JP) ............................. 2004-231869

(51) Int. Cl.
*G11C 11/34* (2006.01)
(52) U.S. Cl. .................................. 365/185.05; 257/316
(58) Field of Classification Search ............ 365/185.05, 365/63; 257/316
See application file for complete search history.

(56) References Cited

U.S. PATENT DOCUMENTS

| 6,166,958 | A | 12/2000 | Naruke et al. | |
|---|---|---|---|---|
| 6,413,821 | B1 | 7/2002 | Ebina et al. | |
| 6,514,854 | B2 * | 2/2003 | Ichise et al. | 438/629 |
| 6,762,449 | B2 * | 7/2004 | Uchiyama et al. | 257/303 |
| 6,798,015 | B2 | 9/2004 | Kasuya | |
| 6,825,076 | B2 * | 11/2004 | Okita | 438/239 |
| 7,015,542 | B2 | 3/2006 | Kasuya | |
| 7,045,848 | B2 | 5/2006 | Shukuri | |
| 7,233,513 | B2 * | 6/2007 | Kamoshida et al. | 365/63 |

FOREIGN PATENT DOCUMENTS

JP      6-333397      12/1994

* cited by examiner

*Primary Examiner*—Anh Phung
(74) *Attorney, Agent, or Firm*—Antonelli, Terry, Stout & Kraus, LLP.

(57) ABSTRACT

A semiconductor memory array includes a first nonvolatile memory cell having a first charge storage layer and a first gate electrode and a second nonvolatile memory cell, adjacent to the first memory cell in a first direction, having a second charge storage layer and a second gate electrode. The first and second electrodes extend in a second direction perpendicular to the first direction, the first electrode has a first contact section extending toward the second electrode in the first direction, and the second electrode has a second contact section extending toward the first electrode in the first direction. The first and second contact positions are shifted in the second direction, respectively, and the first electrode and the first contact section are electrically separated from the second electrode and the second contact section.

16 Claims, 17 Drawing Sheets

| OPERATION \ APPLIED VOLTAGE | Vd | Vcg | Vmg | Vs | Vb |
|---|---|---|---|---|---|
| WRITE | 1V | Vdd | 12V | 6V | 0 |
| ERASE | 0 | Vdd | −5V | 6V | 0 |
| READ | Vdd | Vdd | Vdd | 0 | 0 |

Vdd=1.5V

SEMICONDUCTOR DEVICE

CROSS-REFERENCE TO RELATED APPLICATION

This application is a continuation of U.S. application Ser. No. 11/797,164, filed May 1, 2007, now U.S. Pat. No. 7,502,257, issued on Mar. 10, 2009, which, in turn is a Continuation of U.S. application Ser. No. 11/198,191, filed Aug. 8, 2005 (now U.S. Pat. No. 7,245,531, issued on Jul. 17, 2007), and which said application claims priority from Japanese patent application No. 2004-231869 filed on Aug. 9, 2004, the entire contents of which are hereby incorporated by reference into this application.

BACKGROUND OF THE INVENTION

The present invention relates to a semiconductor device, and particularly to a technique effective if applied to a semiconductor device including a nonvolatile semiconductor memory device.

As one of electrically programmable/erasable nonvolatile semiconductor memory devices, an EEPROM (Electrically Erasable and Programmable Read Only Memory) has been widely used. Each of these memories typified by a flash memory widely used at present has a conductive floating gate electrode and a trap insulating film surrounded by an oxide film, which are placed below a gate electrode of a MISFET, sets a charge stored state at the floating gate or trap insulating film as memory information, and reads it as the threshold voltage of the transistor. The trap insulating film corresponds to an insulating film capable of storing an electrical charge.

As one example, may be mentioned a silicon nitride film or the like. The threshold voltage of the MISFET is shifted by injection/discharge of the electrical charge into and from such a charge storage region and the trap insulating film is operated as a memory element. As the flash memory, may be mentioned a split gate type cell using a MONOS (Metal-Oxide-Nitride-Oxide-Semiconductor) film. Such a memory has the advantages that the use of the silicon nitride film as the charge storage region brings about excellent reliability of data retention because the electrical charge is stored on a discrete basis, as compared with a conductive floating gate film, and the oxide films provided above and below the silicon nitride film can be thinned because the reliability of the data retention is excellent, whereby reductions in the voltages for write/erase operations are made possible.

A technique related to the layout of contacts relative to gate electrodes of a nonvolatile semiconductor memory device has been described in Japanese Unexamined Patent Publication No. 2003-100915 (corresponding to USP 2003/0057505A1) (refer to a patent document 1).

A technique for applying different voltages to word lines of memory cells opposed with a bit line interposed therebetween upon a write operation has been described in Japanese Unexamined Patent Publication No. Hei 6 (1994)-333397 (refer to a patent document 2).

SUMMARY OF THE INVENTION

According to discussions made by the present inventors, the following have been found out.

In two memory cells adjacent to each other with a source region interposed therebetween such as shown in FIG. 8, the potential of each source region is always held at the same potential because the source regions are common. When the potentials of memory gate electrodes are taken out from a common pad in the two memory cells adjacent to each other with the source region interposed therebetween, the same potential is always applied to the memory gate electrodes of the two memory cells.

When a predetermined write voltage is applied to respective portions of a selected memory cell on which writing is effected, upon a write operation, source regions are common and held at the same potential in the selected memory cell and a non-selected memory cell adjacent to the selected memory cell through the source region interposed therebetween. Further, their memory gate electrodes are also brought to the same potential as described above. Therefore, when the write voltage is applied to the selected memory cell, the same voltage as the selected memory cell is applied to the source region of the non-selected memory cell adjacent to the selected memory cell through the source region interposed therebetween, and its memory gate electrode.

Therefore, the potential of a select gate electrode of the non-selected memory cell adjacent to the writing selected memory cell through the source region interposed therebetween cuts off a channel current and prevents disturb of the non-selected memory cell. In fact, however, a high voltage similar to the selected memory cell is applied to the source region and memory gate electrode of the non-selected memory cell as described above. Therefore, a junction leak current occurs between the source and substrate and hot electrons generated with is occurrence are captured into a trap insulating film of the non-selected memory cell, thus causing a possibility that the threshold voltage of a memory transistor of the non-selected memory cell will rise. Thus, the write disturb applied to the non-selected memory cell adjacent to the writing selected memory cell through the source region interposed therebetween becomes a problem, thus causing a possibility that the performance of the semiconductor device will be degraded.

Unless the plane layout of the semiconductor device is designed in consideration of a margin for alignment and a margin for a size variation in a photolithography process, etc., there is a possibility that the production yields of the semiconductor device will be degraded and the semiconductor device will be scaled up.

An object of the present invention is to provide a technique capable of enhancing the performance of a semiconductor device.

Another object of the present invention is to provide a technique capable of improving production yields of a semiconductor device.

The above, other objects and novel features of the present invention will become apparent from the description of the present specification and the accompanying drawings.

Summaries of representative ones of the inventions disclosed in the present application will be explained in brief as follows:

The present invention provides a semiconductor device. In the semiconductor device, a plurality of memory cells are disposed in array form and include a plurality of select gate lines that connect select gate electrodes of the memory cells arranged in a first direction, and a plurality of memory gate lines that connect memory gate electrodes of the memory cells arranged in the first direction, respectively. The memory gate lines connected to their corresponding memory gate electrodes of the memory cells adjacent to each other in a second direction orthogonal to the first direction through a source region interposed therebetween are not electrically connected to each other, and voltages can be applied thereto independently.

Also the present invention provides a semiconductor device. In the semiconductor device, a plurality of memory cells are disposed in array form and include a plurality of select gate lines that connect select gate electrodes of the memory cells arranged in a first direction, and a plurality of memory gate lines that connect memory gate electrodes of the memory cells arranged in the first direction. Each of the select gate lines has a first portion extending in the first direction, and a second portion of which one end is connected to the first portion and extends in a second direction intersecting the first direction. Each of the memory gate lines has a third portion adjacent to the first and second portions of the select gate line through an insulating film interposed therebetween, and a fourth portion which is adjacent to the second portion of the select gate line through the insulating film interposed therebetween and extends in a third direction that intersects with the second direction. A conductor section embedded in a contact hole defined in an interlayer insulating film provided over the fourth portion of each memory gate line, and the fourth portion of the memory gate line are electrically connected.

Advantageous effects obtained by a representative one of the inventions disclosed in the present application will be described in brief as follows:

The performance of a semiconductor device can be enhanced.

Production yields of the semiconductor device can be improved.

DETAILED DESCRIPTION OF THE PREFERRED EMBODIMENTS

Figure 1:
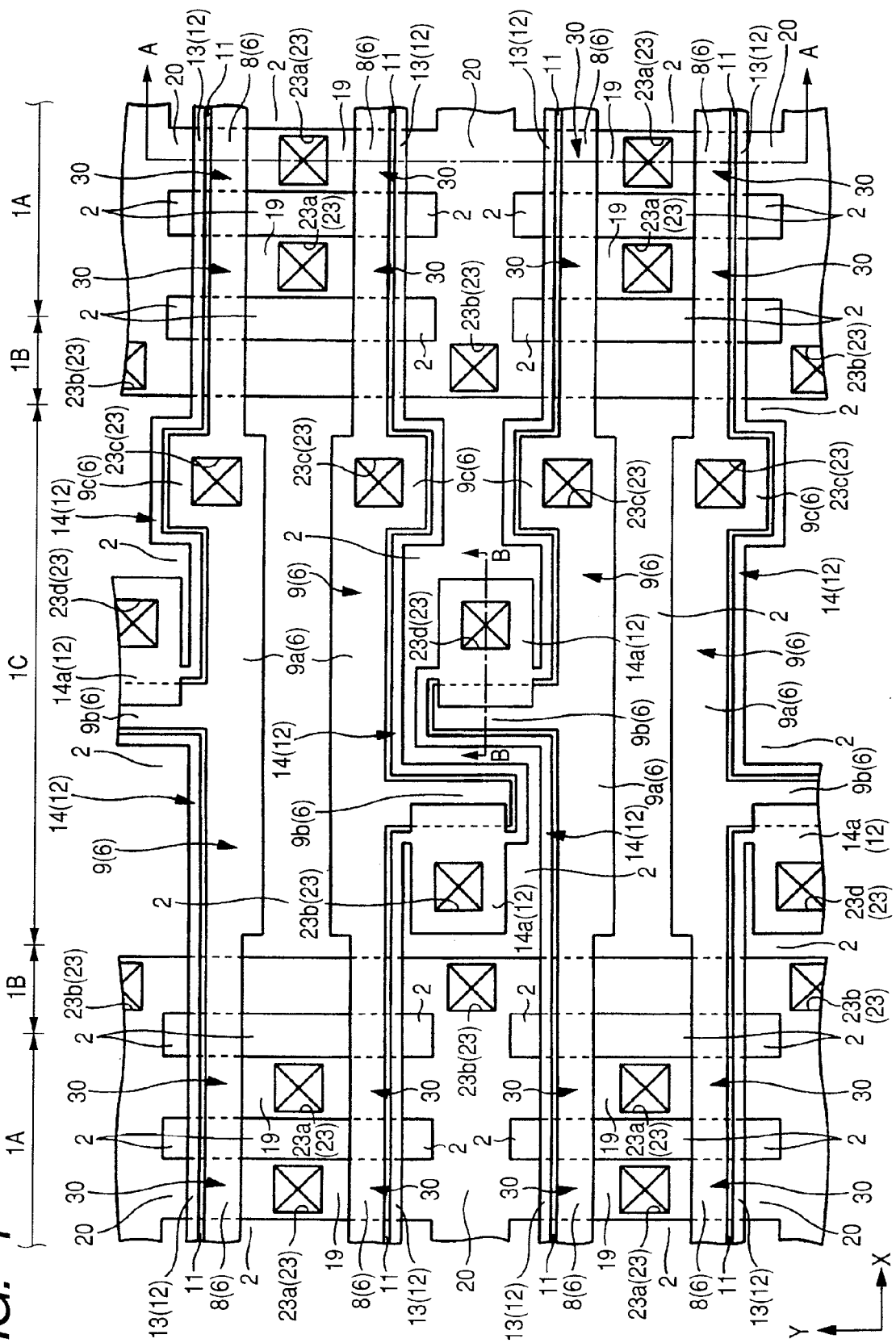
FIG. 1 is a fragmentary plan view of a semiconductor device according to a first embodiment of the present invention.

Whenever circumstances require it for convenience in the following embodiments, they will be described with being divided into a plurality of sections. However, unless otherwise specified in particular, they are not irrelevant to one another. One thereof has to do with modifications, details and supplementary explanations of some or all of the other. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle. It is also needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Preferred embodiments of the present invention will hereinafter be explained with reference to the accompanying drawings. Incidentally, members each having the same function in all the drawings for describing the embodiments are respectively given the same reference numerals and their repetitive explanations will be omitted. Unless necessary in particular, the description of the same or similar parts will not be repeated in principle.

In the drawings used in the embodiments, some hatching might be omitted to make it easy to view the drawings even in the case of sectional views. Further, some hatching might be provided to make it easy to read the drawings even in the case of plan views.

First Preferred Embodiment

Figure 2:
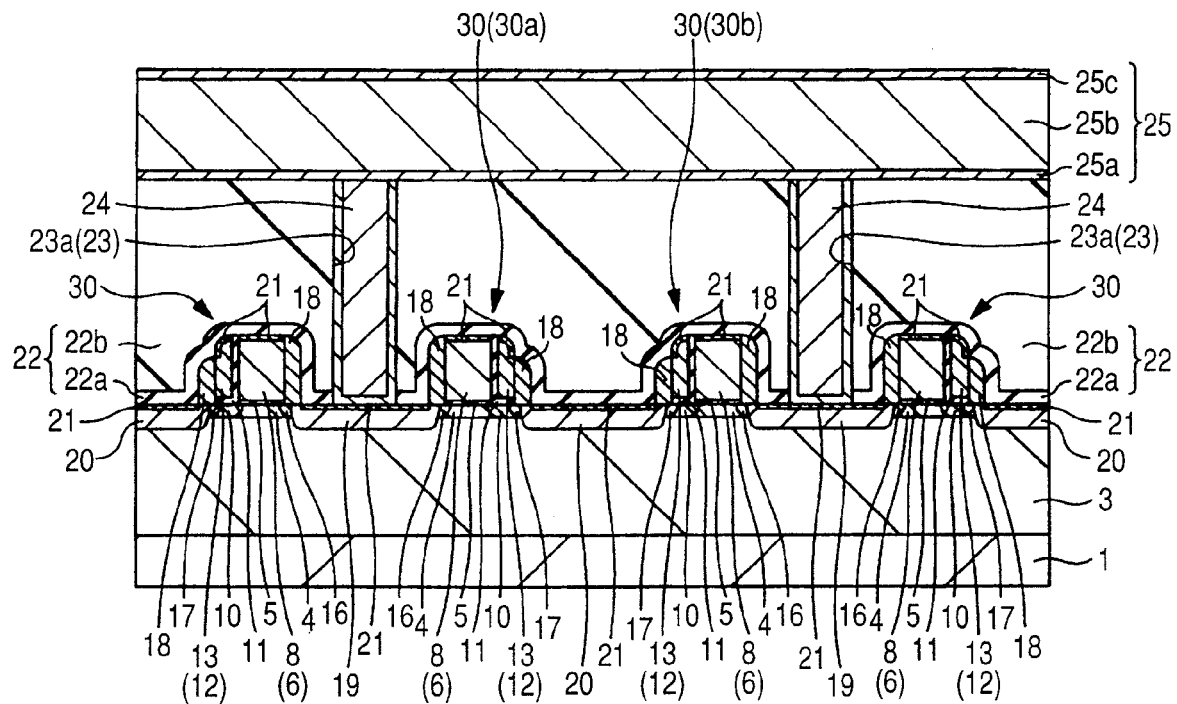
FIG. 2 is a fragmentary sectional view of the semiconductor device according to the first embodiment of the present invention.
Figure 3:
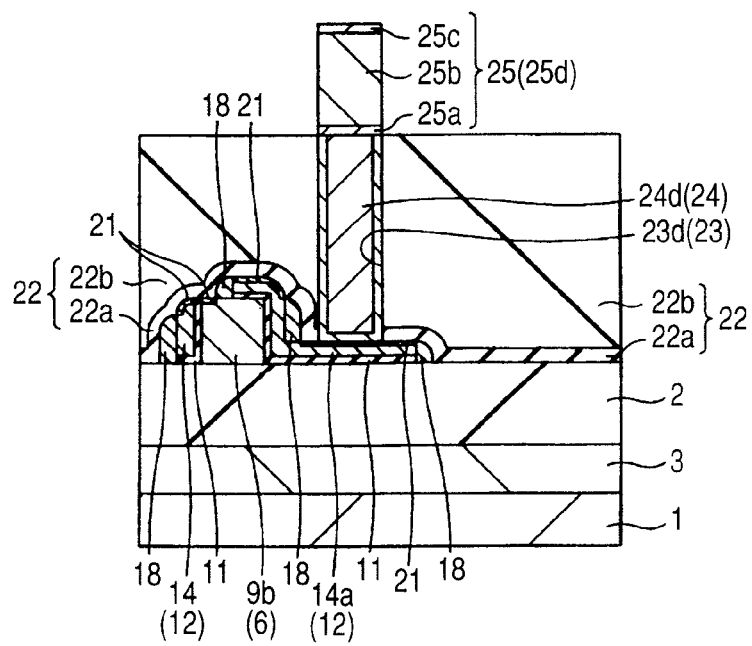
FIG. 3 is a fragmentary sectional view of the semiconductor device according to the first embodiment of the present invention.

A structure of a semiconductor device according to the present embodiment will be explained with reference to the drawings. FIG. 1 is a fragmentary plan view of the semiconductor device (nonvolatile semiconductor memory device) of the present embodiment, and FIGS. 2 and 3 are respectively fragmentary sectional views of the semiconductor device according to the present embodiment, respectively. A section taken along line A-A of FIG. 1 corresponds to FIG. 2, and a section taken along line B-B of FIG. 1 corresponds to FIG. 3. For simplicity of understanding, plane layouts of polycrystalline silicon films 6 each of which forms a select gate electrode 8 and a select gate line 9, polycrystalline silicon films 12 each of which forms a memory gate electrode 13 and a memory gate line 14, drain regions 19, source regions 20 and contact holes 23, etc. are illustrated in FIG. 1. Illustrations of other components are omitted. Sidewall spacers 18 are not illustrated in the plan view of FIG. 1. Low-concentration n-type semiconductor regions 16 and low-concentration n-type semiconductor regions 17 are illustrated so as to be included in the drain region 19 and the source region 20 respectively.

The semiconductor device according to the present embodiment shown in FIGS. 1 through 3 is of a semiconductor device which includes nonvolatile semiconductor memory devices (nonvolatile memory and a flash memory).

MISFETs (Metal Insulator Semiconductor Field Effect Transistors; MIS transistor and MIS type field effect transistor) each used as a memory cell of a nonvolatile memory are formed in memory cell regions (memory cell forming region and memory cell array forming region) of a semiconductor substrate (semiconductor wafer) 1 constituted of p-type monocrystalline silicon or the like having specific resistivity ranging from approximately 1 to 10 Ωcm, for example.

Element isolation regions 2 for isolating elemental devices are formed in the semiconductor substrate 1. A p-type well 3 is formed in each of active regions separated by the element isolation regions 2. A memory cell 30 of a nonvolatile memory comprising a memory transistor and a selection transistor is formed in its corresponding p-type well 3 of each memory cell region 1A. A plurality of the memory cells 30 are formed in the individual memory cell regions 1A in array form. The respective memory cell regions 1A are electrically isolated from other regions by the element isolation regions 2.

Each memory cell 30 of the flash memory (nonvolatile semiconductor memory device) formed in the memory cell region 1A is of a split gate type cell using a MONOS film. As shown in FIG. 2, each of the memory cells 30 includes an insulating film 11 formed as a gate insulating film of a memory transistor, a memory gate electrode 13 (word line 13) constituted of a conductor like n-type polycrystalline silicon, a select gate electrode (control gate electrode) 8 constituted of a conductor like n-type polycrystalline silicon, a gate insulating film 5 located below the select gate electrode 8, a low-concentration n-type semiconductor region (low-concentration n-type impurity region) 16 and a drain region (drain diffusion layer and high-concentration n-type semiconductor region) 19 of a drain section, and a low-concentration n-type semiconductor region (low-concentration n-type impurity region) 17 and a source region (source diffusion layer and high-concentration n-type semiconductor region) 20 of a source section. The memory gate electrode 13 of each individual memory cell 30 constitutes a word line of each memory cell. The select gate electrode 8 and memory gate electrode 13 of each memory cell 30 are formed over the semiconductor substrate 1 located above between the drain region 19 and the source region 20. The select gate electrode 8 is located on the drain region 19 side. The memory gate electrode 13 is placed on the source region 20 side and adjacent to the select gate electrode 8 with the insulating film 11 interposed therebetween. The gate insulating film 5 is interposed between the select gate electrode 8 and the semiconductor substrate 1. The insulating film 11 that serves as a gate insulating film having a charge storage section is interposed between the memory gate electrode 13 and the semiconductor substrate 1. The memory gate electrode 13 is formed over each sidewall of the select gate electrode 8 in sidewall form with the insulating film 11 interposed therebetween.

Now, a MISFET constituted of the memory gate electrode 13 is called a "memory transistor", and a MISFET constituted of the select gate electrode (control gate electrode) 8 is called a "selection transistor (control transistor)".

The memory cells 30 of the flash memory (nonvolatile semiconductor memory device) are arranged plural in array form over a main surface of the semiconductor substrate 1. The select gate electrodes 8 of the memory cells 30 arranged in an X direction (direction, i.e., first direction parallel to the main surface of the semiconductor substrate 1) of FIG. 1, of the plurality of memory cells 30 disposed in array form (matrix form) in the X and Y directions of FIG. 1 are electrically connected by their corresponding select gate lines 9 each formed of a conductor layer (i.e., polycrystalline silicon film 6) identical to the select gate electrodes 8 in layer. The memory gate electrodes 13 of the memory cells 30 arranged in the X direction of FIG. 1 are electrically connected by their corresponding memory gate lines 14 each formed of a conductor layer (i.e., polycrystalline silicon film 12) identical to the memory gate electrodes 13 in layer. Each of the memory gate electrodes 13 is adjacent to its corresponding select gate line 9 with the insulating film 11 interposed therebetween. Each of the memory gate lines 14 is adjacent to its corresponding select gate line 9 with the insulating film 11 interposed therebetween. Incidentally, the Y direction of FIG. 1 corresponds to the direction that intersects the X direction, and may preferably be a direction normal to the X direction.

The gate insulating film 5 is constituted of an insulating film such as a silicon oxide film. The insulating film 11 is of an insulating film (trap-like insulating film) having a charge storage section thereinside. For instance, the insulating film 11 comprises a laminated or stacked film (ONO (Oxide-Nitride-Oxide) film) of a silicon nitride film (i.e., charge storage section) for storing an electrical charge, and silicon oxide films located thereabove and therebelow. Each of the insulating films 11 is formed below the memory gate electrode 13, below the memory gate line 14, between the adjacent select gate electrode 8 and memory gate electrode 13 and between the adjacent select gate line 9 and memory gate line 14. The insulating film 11 placed below the memory gate electrode 13 is used as a gate insulating film (gate insulating film having charge storage section thereinside) of each memory transistor.

Each of the low-concentration n-type semiconductor region 16, low-concentration n-type semiconductor region 17, drain region 19 and source region 20 comprises a semiconductor region (silicon region) in which an n-type impurity (e.g., Phosphorous (P) or Arsenic (As) or the like) has been introduced, and is formed in the p-type well 3 provided in the semiconductor substrate 1. The drain region 19 is higher than the low-concentration n-type semiconductor region 16 of the drain section in impurity concentration, and the source region 20 is higher than low-concentration n-type semiconductor region 17 of the source section in impurity concentration. Of the plurality of memory cells 30, the (adjoining) memory cells 30 adjacent to one another in the Y direction of FIG. 1 through the drain regions 19 respectively share the drain regions 19. Also the (adjoining) memory cells 30 adjacent to one another in the Y direction of FIG. 1 through the source regions 20 respectively share the source regions 20.

Sidewall spacers 18 each formed of an insulating film such as silicon oxide are formed over their corresponding sidewalls of the select gate electrodes and their corresponding sidewalls of the memory gate electrodes 13. That is, each of the sidewall spacers 18 is formed over its corresponding sidewall of the memory gate electrode 13 on the side opposite to the side adjacent to the select gate electrode 8 with the insulating film 11 interposed therebetween and over its corresponding sidewall of the select gate electrode 8 on the side opposite to the side adjacent to the memory gate electrode 13 with the insulating film 11 interposed therebetween.

Each of the low-concentration n-type semiconductor regions 16 of the drain section is formed on a self-alignment basis with respect to its corresponding select gate electrode 8. Each of the drain regions 19 is formed on a self-alignment basis with respect to its corresponding sidewall spacer 18 placed over each sidewall of the select gate electrode 8. Therefore, the low-concentration n-type semiconductor region 16 is formed below the sidewall spacers 18 placed over the select gate electrode 8, and the drain region 19 is formed outside the low-concentration n-type semiconductor region 16. Thus, the low-concentration n-type semiconductor region 16 is formed so as to be adjacent to a channel region of each selection transistor. The drain region 19 is held close to the low-concentration n-type semiconductor region 16 and formed so as to be spaced away from the channel region of the selection transistor by the low-concentration n-type semiconductor region 16. The low-concentration n-type semiconductor region 17 of the source section is formed on a self-alignment basis with respect to its corresponding memory gate electrode 13, and the source region 20 is formed on a self-alignment basis with respect to the sidewall spacers 18 placed over the sidewalls of the memory gate electrodes 13. Therefore, the low-concentration n-type semiconductor region 17 is formed below its corresponding sidewall spacer 18 placed over the sidewall of the memory gate electrode 13, and the source region 20 is formed outside the low-concentration n-type semiconductor region 17. Thus, the low-concentration n-type semiconductor region 17 is formed so as to adjoin the channel region of the memory transistor. The source region 20 is held close to the low-concentration n-type semiconductor region 17 and formed so as to be spaced away from the channel region of the memory transistor by the low-concentration n-type semiconductor region 17.

Each of the select gate electrodes 8 is formed by patterning a polycrystalline silicon film (polycrystalline silicon film implanted with an n-type impurity or doped therewith) 6 formed over the semiconductor substrate 1. The patterned polycrystalline silicon films 6 that form the select gate electrodes 8 extend in the X direction of FIG. 1 and connect the select gate electrodes 8 of the individual memory cells 30 to one another. Thus, the patterned polycrystalline silicon films 6 form the select gate electrodes 8 of the respective memory cells 30 and the select gate lines 9 that connect between the select gate electrodes 8 of the memory cells 30 arranged in the X direction of FIG. 1. That is, the select gate electrodes 8 and the select gate lines 9 are formed by the conductor films (conductor layers) identical in layer formed in the same process.

The memory gate electrodes 13 are formed by anisotropically etching the polycrystalline silicon films (polycrystalline silicon films each implanted with an n-type impurity or doped therewith) 12 formed over the semiconductor substrate 1 so as to cover the select gate electrodes 8 and allowing the polycrystalline silicon films 12 to remain over the sidewalls of the select gate electrodes 8 with the insulating films 11 each interposed therebetween. The polycrystalline silicon films 12 that form the memory gate electrodes 13 are formed over one sidewalls of the patterned polycrystalline silicon films 6 that constitute the select gate electrodes 8 and the select gate lines 9 and extend in the X direction (transverse direction) of FIG. 1, and connect the memory gate electrodes 13 of the respective memory cells 30 to one another. Thus, the polycrystalline silicon films 12 provided over the sidewalls of the patterned polycrystalline silicon films 6 that constitute the select gate electrodes 8 and the select gate lines 9 form the memory gate electrodes 13 of the respective memory cells 30 and the memory gate lines 14 that connect between the memory gate electrodes 13 of the memory cells 30 arranged in the X direction of FIG. 1. The memory gate lines 14 are formed in a word shunt region 1C that connect the respective memory cell regions 1A and disposed such that a common potential is applied to the memory cells 30 of the respective memory cell regions 1A, and connect the memory gate electrodes 13 of the respective memory cells 30. That is, the memory gate electrodes 13 and the memory gate lines 14 are formed by the conductor films (conductor layers) identical in layer formed in the same process. The polycrystalline silicon film 12 formed over one sidewall of each select gate electrode 8 with the insulating film 11 interposed therebetween results in the memory gate electrode 13, whereas the polycrystalline silicon film 12 formed over one sidewall of each select gate line 9 with the insulating film 11 interposed therebetween results in the memory gate line 14.

The select gate electrode 8 and the memory gate electrode 13 of each of the selection transistor and the memory transistor that respectively constitute the memory cells 30 are adjacent to each other with the insulating film 11 interposed therebetween. Further, the select gate line 9 and the memory gate line 14 are adjacent to each other with the insulating film 11 interposed therebetween. A channel region of the memory transistor is formed below its corresponding insulating film 11 placed below the memory gate electrode 13, and a channel region of the selection transistor is formed below its corresponding gate insulating film 5 placed below the select gate electrode 8.

A p-type semiconductor region 4 for adjustment of the threshold voltage of the selection transistor is formed as needed in a channel forming region of the selection transistor placed below the gate insulating film 5 provided below each select gate electrode 8, whereas a p-type semiconductor region (or n-type semiconductor region) 10 for adjustment of the threshold voltage of the memory transistor is formed as needed in a channel forming region of the memory transistor placed below the insulating film 11 provided below each memory gate electrode 13.

A metal silicide film 21 (e.g., cobalt silicide film) is formed over upper surfaces (surfaces) of the select gate electrodes 8, select gate lines 9, memory gate electrodes 13, memory gate lines 14, drain regions 19 and source regions 20 by a salicide process or the like. The metal silicide film 21 can bring a diffusion resistance and a contact resistance into low-resistance form.

An insulating film (interlayer insulating film) 22 is formed as an interlayer insulating film so as to cover the select gate electrodes 8 and the memory gate electrodes 13. The insulating film 22 comprises, for example, a laminated film or the like of relatively thin silicon nitride 22a and relatively thick silicon oxide 22b provided thereon. The silicon nitride 22a can function as an etching stopper film at the formation of each contact hole 23. The contact holes (openings) 23 are defined in the insulating film 22, and plugs (conductor sections) 24 each formed of a conductive film constituted principally of a tungsten (W) film are formed in their corresponding contact holes 23. A wiring (first wiring layer) 25 is formed over the insulating film 22 with the plugs 24 embedded therein. The wiring 25 is of an aluminum wiring constituted of, for example, a laminated or stacked film of a barrier conductor film 25a, an aluminum film 25b and a barrier conductor film 25c. The barrier conductor films 25a and 25c are respectively made up of, for example, a titanium film, a titanium nitride film or their laminated film. The wiring 25 is not limited to the aluminum wiring and can be altered in various ways. The wiring 25 can also be constituted as, for example, a tungsten wiring or copper wiring (buried copper wiring formed by the damascene method, for example).

Of the contact holes 23 and the plugs 24 that bury them, contact holes 23a for connecting to the drain regions 19 and plugs 24a that bury them are formed over the drain regions 19 of the respective memory cells 30 of each memory cell region 1A. Contact holes 23b for connecting to the source regions 20 and plugs 24b that bury them are formed over the source regions 20 of a source dummy region 1B at an end (outer peripheral portion) of each memory cell region 1A. Contact holes 23c for connecting to the select gate lines 9 and plugs 24c that bury them are formed over the select gate lines 9 of the word shunt region 1C between the memory cell regions 1A. Contact holes 23d for connecting to the memory gate lines 14 and plugs 24d that bury them are formed over the memory gate lines 14 of the word shunt region 1C between the memory cell regions 1A. Incidentally, an element isolation region 2 is formed in the word shunt region 1C over its entirety, and the select gate lines 9 and the memory gate lines 14 are formed over the element isolation region 2 of the word shunt region 1C. Since the contact holes 23b for connecting to the source regions 20 and the plugs 24b that bury them are disposed in the source dummy region 1B at the end (outer peripheral portion) of each memory cell region 1A, the source dummy region 1B is taken as a memory cell dummy region and results in a measure against a crystal defect.

The select gate lines 9 and the memory gate lines 14 will next be explained in more detail.

Each of the select gate lines 9 has a first portion 9a which extends in the X direction of FIG. 1 and connects the select gate electrodes 8 of the memory cells 30 arranged in the X direction to one another, and a second portion 9b whose one end is connected to the first portion 9a and extends in the Y direction (the direction, i.e., second direction parallel to the main surface of the semiconductor substrate 1 and orthogonal to the X direction). That is, the second portion 9b of the select gate line 9 extends in the direction that intersects with the direction in which the first portion 9a extends, more preferably in the direction orthogonal (vertical) to the direction in which the first portion 9a extends.

The distance from the end of the second portion 9b extended in the Y direction to the select gate line 9 (first portion 9a) opposite thereto through the source region and the memory gate line 14 is shorter than the length of the second portion 9b as viewed in the Y direction. That is, the length of the second portion 9b as viewed in the Y direction is caused to extend where practicable in terms of design dimensions. It is thus possible to easily ensure space as viewed in the Y direction for a contact section 14a of each memory gate line, which is formed so as to extend in the X direction from the second portion 9b and to make it easy to prevent each contact hole 23d from misalignment.

Further, the length as viewed in the Y direction, of the second portion 9b of the select gate line is formed so as to be longer than the length thereof as viewed in the X direction. Thus, since the length necessary to extend the contact section 14a of the memory gate line in the X direction can be lengthened, it is possible to make it easy to prevent the contact hole 23d from misalignment.

The first portion 9a of each select gate line 9 is relatively made wide in width (width in the Y direction) at a portion below each contact hole 23c. The contact hole 23c is formed over its corresponding wide portion (third portion) 9c of the first portion 9a of the select gate line 9. Each of the plugs 24c is connected to its corresponding wide portion 9c of the first portion 9a of the select gate line 9 at the bottom of the contact hole 23c. Forming the contact holes 23c over the wide portions 9c relatively broad in width and connecting the plugs 24c embedded in the contact holes 23c to the wide portions 9c respectively make it possible to prevent the contact holes 23c from being misaligned, assuredly expose the select gate lines 9 at the bottoms of the contact holes 23c and reliably connect (electrically connect) the plugs 24c to the select gate lines 9 respectively. It is also possible to prevent the memory gate lines 14 from being exposed at the bottoms of the contact holes 23c and prevent the select gate lines 9 and the memory gate lines 14 from being short-circuited. Incidentally, the first portion 9a, second portion 9b and wide portion 9c of each select gate line 9 are constituted of the patterned polycrystalline silicon films 6 as described above.

The memory gate line 14 is formed over one sidewall of the select gate line 9 with the insulating film 11 interposed therebetween. Thus, the memory gate line 14 is formed over its corresponding sidewalls of the first portion 9a, second portion 9b and wide portion 9c of each select gate line 9 with the insulating film 11 interposed therebetween. While the memory gate line 14 is formed on one sidewall of the select gate line 9 in sidewall form with the insulating film 11 interposed therebetween, it is further adjacent to the second portion 9b of the select gate line 9 through the insulating film 11 and has the corresponding contact section 14a that extends in the X direction of FIG. 1. The contact section 14a of the memory gate line 14 is also made up of the polycrystalline silicon film 12 in a manner similar to the sidewalled portion of the memory gate line 14. Thus, the contact section 14a of the memory gate line 14 extends in the direction that intersects with the direction (Y direction) in which the second portion 9b of the select gate line 9 extends, more preferably, extends in the direction (direction orthogonal to the direction (Y direction) in which the second portion 9a extends) parallel to the X direction of FIG. 1. Since the element isolation region 2 is formed over the entire word shunt region 1C as described above and the select gate lines 9 and memory gate lines 14 are formed over the element isolation region 2, the contact sections 14a of the memory gate lines 14 extend in the X direction of FIG. 1 from over the second portions 9b of the select gate lines 9 to over the element isolation region 2. The insulating film 11 is interposed between the contact section 14a of each memory gate line 14 and the second portion 9b of each select gate line 9.

As described above, the memory gate electrodes 13 and the memory gate lines 14 each comprising the polycrystalline silicon film 12 can be formed by anisotropically etching the polycrystalline silicon films 12 formed over the semiconductor substrate 1 so as to cover the patterned polycrystalline silicon films 6 constituting the select gate electrodes 8 and the select gate lines 9 and allowing the polycrystalline silicon films 12 to remain over one sidewalls of the patterned polycrystalline silicon films 6 with the insulating films 11 each interposed therebetween. In the anisotropic etching process of the polycrystalline silicon films 12, an etching mask layer (photoresist layer not shown) is formed over each contact section 14a and the polycrystalline silicon film 12 below the etching mask layer is caused to remain, whereby the contact section 14a of each select gate line 9 is formed. Thus, a plan pattern shape of the etching mask layer (photoresist layer) used at this time corresponds to a plan pattern shape of the contact section 14a. Accordingly, the memory gate electrodes 13, the memory gate lines 14 and the contact sections 14a of the memory gate lines 14 are formed of the same conductor layers (polycrystalline silicon films 12 in the present embodiment).

The contact holes 23d are formed over the contact sections 14a of the memory gate lines 14. The plugs 24d are electrically connected to their corresponding contact sections 14a of the memory gate lines 14 at the bottoms of the contact holes 23d. The plan pattern shape of each contact section 14a is formed in such a predetermined size as not to cause misalignment in consideration of a displacement of the contact hole 23d at its opening. It is thus possible to prevent misalignment of the contact holes 23d, reliably expose the contact sections 14a of the memory gate lines 14 at the bottoms of the contact holes 24d and assuredly connect (electrically connect) the plugs 24d to the memory gate lines 14. The contact sections 14a of the memory gate lines 14 extend from over the second portions 9b of the select gate lines 9 to over the corresponding element isolation region 2 respectively, and the contact holes 23d are respectively formed over the contact sections 14a located above the corresponding element isolation region 2. Therefore, since the contact sections 14a of the memory gate lines 14 and the element isolation region 2 are exposed at the bottoms of the contact holes 23d even though misalignment occurs in the contact holes 23d, the plugs 24d embedded into the misaligned contact holes 23d can be prevented from being shorted with other conductive members. Since the element isolation region 2 is exposed at the bottom of each contact hole 23d even if overetching occurs in the forming process of the contact hole 23d, each of the plugs 24d embedded in the contact holes 23d can be prevented from being shorted with other conductive member. Further, electrical connections between the plugs 24d and the contact sections 14d of the memory gate lines 14 can be ensured by contact between the lower side faces of the plugs 24d and the contact sections 14a of the memory gate lines 14.

In the present embodiment, the respective memory gate lines 14 are provided with the independent contact sections 14a respectively. The (two) memory gate lines 14 respectively connected to the memory gate electrodes 13 of the memory cells 30, which adjoin each other (are adjacent and opposite to each other) through the source region 20 (being interposed therebetween) as viewed in the Y direction of FIG. 1, are not electrically connected to each other.

Incidentally, the memory cell 30a and the memory cell 30b has the relationship that they adjoin each other in the Y direction with the source region 20 interposed therebetween (they are adjacent and opposite to each other) in FIG. 2 by way of example. In the present embodiment, the (two) memory gate lines 14 respectively connected to the memory gate electrodes 13 of the memory cells 30 (e.g., the memory cell 30a and memory cell 30b in FIG. 2), which adjoin each other in the Y direction of FIG. 1 with the source region 20 interposed therebetween, will be referred to as the (two) memory gate lines 14 adjacent to each other in the Y direction of FIG. 1 with the source region 20 interposed therebetween.

In the present embodiment, the (two) memory gate lines 14 adjacent to each other in the Y direction of FIG. 1 with the source region 20 interposed therebetween are displaced or shifted in the X direction of FIG. 1 in terms of the positions for connections of the contact sections 14a and plugs 24d in the word shunt region 1C. The memory gate lines 14 are respectively electrically connected to different wirings 25 (25d) which are formed over the insulating film 22 and extend in the Y direction. That is, the memory gate lines 14 are electrically connected via the plugs 24d and wirings 25 (25d) to other memory gate lines 14 other than the memory gate lines 14 adjacent to one another in the Y direction with the source region 20 interposed therebetween. In the example shown in FIG. 1, the memory gate lines 14 are electrically connected on alternate lines through the plugs 24d and wirings 25 (wirings 25d). Therefore, the (two) memory gate lines 14 respectively connected to the memory gate electrodes 13 of the memory cells 30 adjacent to each other in the Y direction of FIG. 1 with the source region 20 interposed therebetween, i.e., the (two) memory gate lines 14 adjacent to each other in the Y direction with the source region 20 interposed therebetween are configured in such a manner that desired voltages (different voltages) can independently be applied thereto through the plugs 24d and contact sections 14a. Therefore, in the present embodiment, independent different voltages (potentials) can respectively be applied to the memory gate electrodes 13 of the memory cells 30 (e.g., the memory cell 30a and the memory cell 30b) adjacent to each other in the Y direction with the source region 20 interposed therebetween.

Since a process margin is easily ensured in the present embodiment as will be described later, it is possible to form the metal silicide film 21 over the upper-surfaces of the select gate lines 9 and the memory gate lines 14, prevent a break in the metal silicide film 21 and bring the select gate lines 9 and the memory gate lines 14 into low-resistance form. It is therefore possible to bring the number of the plugs 24 connected to the respective select gate lines 9 and the memory gate lines 14 into one. Thus, a reduction in plane layout area of the semiconductor device and the like can be carried out.

Figures 4, 5:
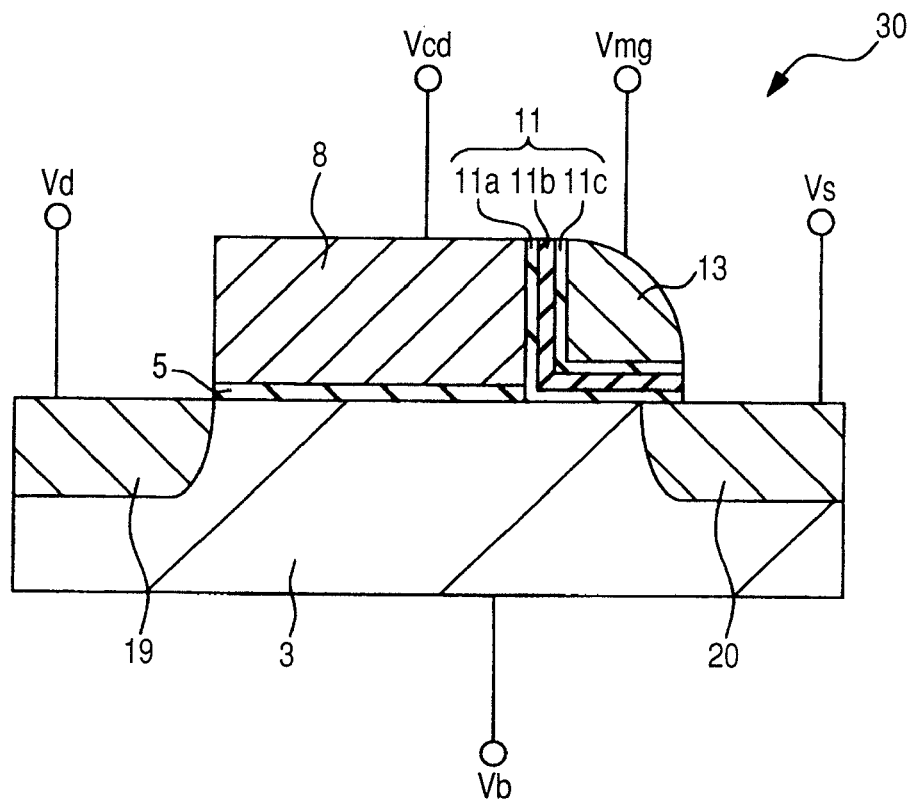
FIG. 4 is a fragmentary sectional view showing a typical sectional structure of a memory cell.
FIG. 5 is a table showing one example illustrative of a condition for application of voltages to respective portions of a selected memory cell at "write", "erase" and "read"

FIG. 4 is a fragmentary sectional view showing a typical sectional structure of a memory cell 30 employed in the semiconductor device according to the present embodiment. FIG. 5 is a table showing one example illustrative of a condition for application of voltages to respective portions of a selected memory cell at "write", "erase" and "read". At the "write", "erase" and "read", a voltage Vd applied to a drain region 19 of such a memory cell (selected memory cell) as shown in FIG. 4, a voltage Vcg applied to a select gate electrode 8 (select gate line 9), a voltage Vmg applied to a memory gate electrode 13 (memory gate line 14), a voltage Vs applied to a source region 20, and a base voltage Vb applied to a p-type well 3 are described in Table shown in FIG. 5. Incidentally, ones shown in Table of FIG. 5 are shown as one example illustrative of the voltage application condition. The voltage application condition is not limited to it and can be altered in various ways as needed. In the present embodiment, the implantation of electrons into a silicon nitride film corresponding to a charge storage section in an insulating film of a memory transistor will be defined as "write" and the injection of holes (positive holes) therein will be defined as "erase", respectively. As shown in FIG. 4, the insulating film 11 comprises a laminated film (ONO film) of a silicon oxide film 11a, a silicon nitride film 11b and a silicon oxide film 11c. The silicon nitride film 11b serves as the charge storage section for storing an electrical charge therein.

As a write method, hot electron write called "so-called source side injection system" can be used. For example, such voltages as shown in the column of "write" in FIG. 5 are applied to respective portions of a selected memory cell on which writing is effected, and electrons are implanted into the silicon nitride film 11b of the insulating film 11 of the selected memory cell. Hot electrons are generated in a lower channel region (between the source and drain) between the two gate electrodes (memory gate electrode 13 and select gate electrode 8). The hot electrons are locally injected into a region on the selection transistor side, of the silicon nitride film 11b corresponding to the charge storage section in the insulating film 11 below the memory gate electrode 13. The injected hot electrons are captured into a trap in the silicon nitride film 11b of the insulating film 11. As a result, the threshold voltage of the memory transistor rises.

An erase method can make use of a BTBT (Band-To-Band Tunneling) hot hole injection erase system. That is, holes (positive holes) generated by the BTBT are injected into the charge storage section (the silicon nitride film 11b of the insulating film 11) to thereby perform erasing. For example, such voltages as shown in the column of "erase" of FIG. 5 are applied to respective portions of a selected memory cell on which erasing is effected, and holes (positive holes) are generated by the BTBT to accelerate an electric field, thereby injecting the holes into the silicon nitride film 11b of the insulating film 11 of the selected memory cell, whereby the threshold voltage of the memory transistor is reduced.

Upon reading, for example, such voltages as shown in the column of "read" of FIG. 5 are applied to respective portions of a selected memory cell to be read. By setting the voltage Vmg applied to the memory gate electrode 13 at the reading to a value between the threshold voltage of the memory transistor in a write state and the threshold voltage thereof in an erase state, the write state and the erase state can be discriminated.

Figure 6:
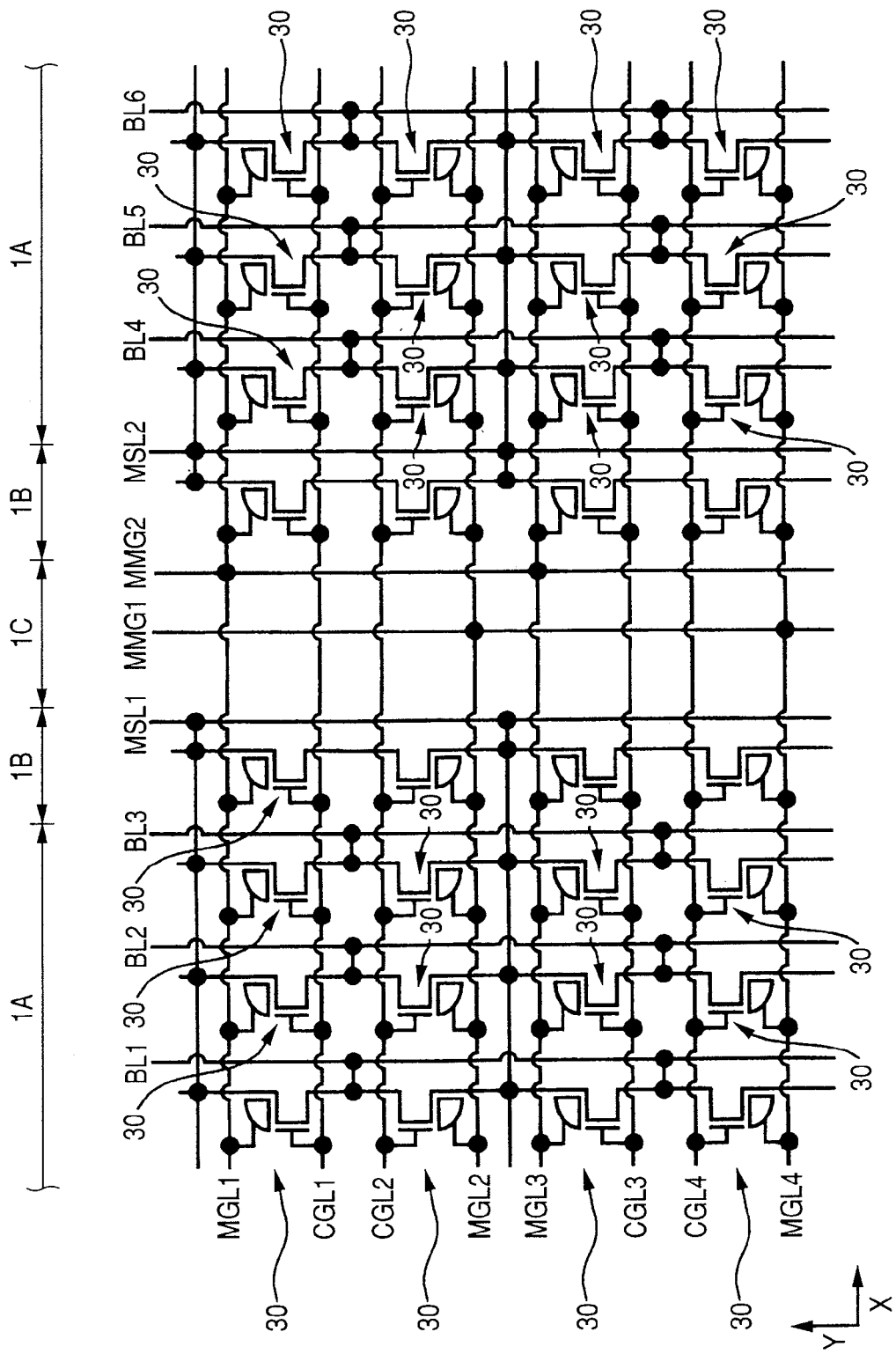
FIG. 6 is a fragmentary circuit diagram (equivalent circuit diagram) of the semiconductor device according to the first embodiment of the present invention.

FIG. 6 is a fragmentary circuit diagram (equivalent circuit diagram) of the semiconductor device according to the present embodiment. As shown even in the circuit diagram of FIG. 6, a plurality of memory cells 30 are formed in each memory cell region 1A and disposed in array form. Drain regions 19 of the respective memory cells 30 are connected to their corresponding bit lines BL1 through BL6 (comprising wirings 25) that extend in a Y direction. Source regions (20) of the respective memory cells 30 are connected to their corresponding source lines MSL1 and MSL2 (comprising wirings 25) that extend in the Y direction, in source dummy regions 1B. Select gate electrodes (8) of the memory cells 30 arranged in an X direction are electrically connected by their corresponding select gate lines CGL1 through CGL4 (corresponding to select gate lines 9). Memory gate electrodes (13) of the memory cells 30 arranged in the X direction are electrically connected by their corresponding memory gate lines MGL1 through MGL4 (corresponding to memory gate lines 14). The memory gate lines MG11 through MGL4 are connected to their corresponding memory gate wirings MMG1 and MMG2 (comprising wirings 25) extending in the Y direction in a word shunt region 1C. As shown even in the circuit diagram of FIG. 6, the memory gate lines, the memory gate line MGL2 and memory gate line MGL3 in the example of FIG. 6 respectively connected to the memory gate electrodes (13) of the memory cells 30 adjacent to each other in the Y direction with the source regions thereof interposed therebetween are not electrically connected to each other. One memory gate line MGL2 is connected to the memory gate wiring MMG1 in the word shunt region 1C, whereas the other memory gate line MGL3 is connected to the other memory gate wiring MMG2 in the word shunt region 1C. Therefore, predetermined (desired) voltages can independently be applied to the memory gate lines adjacent to each other in the Y direction with the source regions 20 thereof interposed therebetween, i.e., the memory gate line MGL2 and the memory gate line MGL3 in the present example through the memory gate lines MMG1 and MMG2. Therefore, different voltages (potentials) can be applied to the memory gate lines (memory gate lines MGL2 and MGL3 in the present example) adjacent to each other in the Y direction with the source regions 20 interposed therebetween, through the memory gate wirings MMG1 through MMG2. Accordingly, the voltages can independently be applied to the memory gate electrodes of the memory cells 30 adjacent to each other through the source regions 20 thereof and hence different voltages can be applied thereto respectively.

Figure 7:
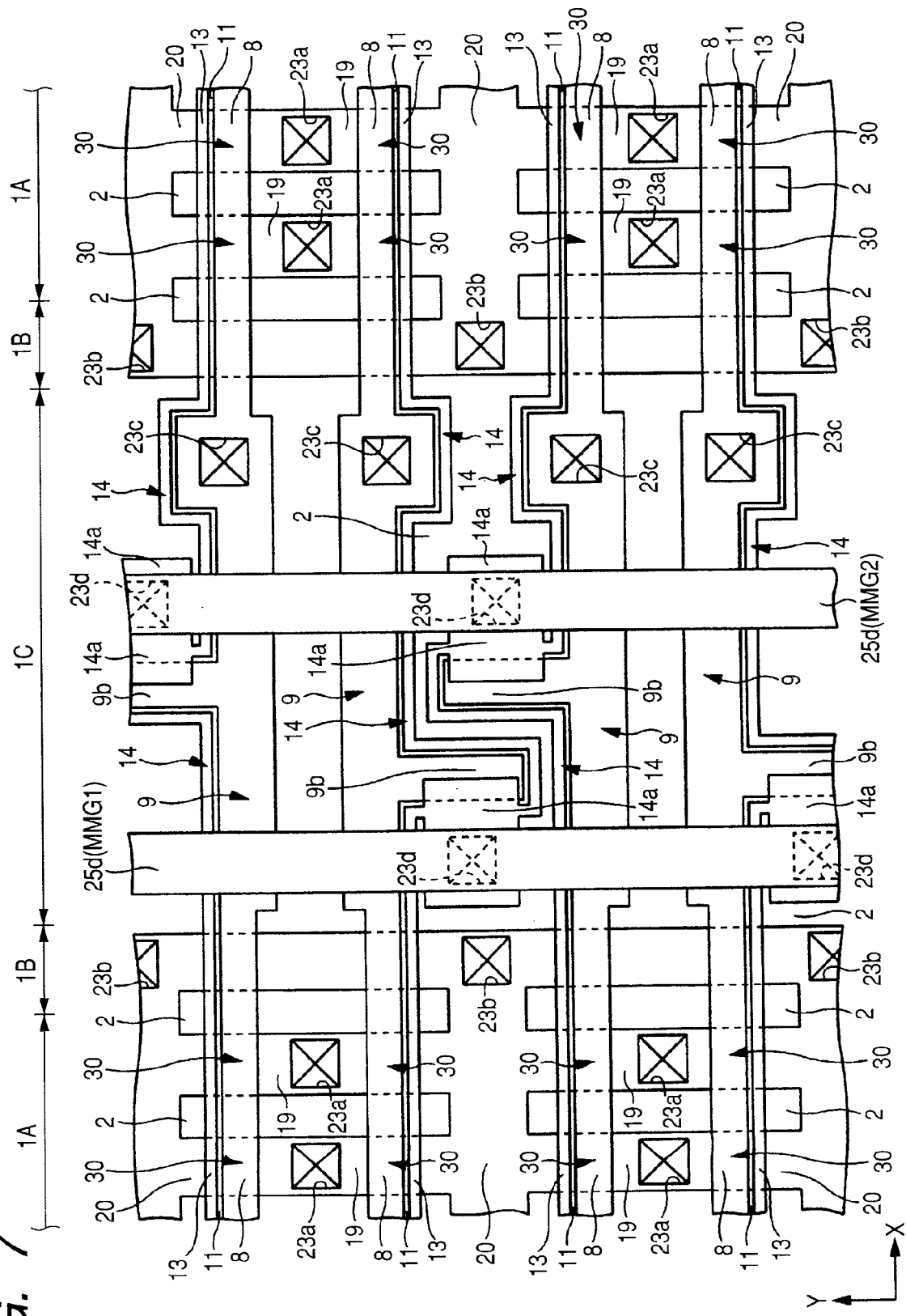
FIG. 7 is a fragmentary plan view of the semiconductor device according to the first embodiment of the present invention.

FIG. 7 is a fragmentary plan view of the semiconductor device according to the present embodiment. The figure corresponds to one in which wirings 25d (i.e., wirings 25d corresponding to the memory gate wirings MMG1 and MMG2 shown in FIG. 6) connected to the memory gate lines 14, of the wirings 25 are further added to and described in FIG. 1. In the word shunt region 1C, the wirings 25d are electrically connected to their corresponding contact sections 14a of the memory gate lines 14 through the plugs 24d that bury the contact holes 23d. As shown in FIG. 7, the (two) memory gate lines 14 respectively connected to the memory gate electrodes 13 of the memory cells 30 adjacent to each other in the Y direction with the source region 20 interposed therebetween, i.e., the (two) memory gate lines 14 adjacent to each other in the Y direction with the source region 20 interposed therebetween are not electrically connected to each other. One memory gate line 14 is connected to its corresponding wiring 25d in the word shunt region 1C, whereas the other memory gate line 14 is connected to its corresponding other wiring 25d in the word shunt region 1C. Therefore, predetermined (desired) voltages can independently be applied to the (two) memory gate lines 14 adjacent to each other with the source region 20 interposed therebetween, through the wirings 25d. Different voltages (potentials) can be applied to the (two) memory gate lines 14 adjacent to each other with the source region 20 interposed therebetween, through the wirings 25d.

Figure 8:
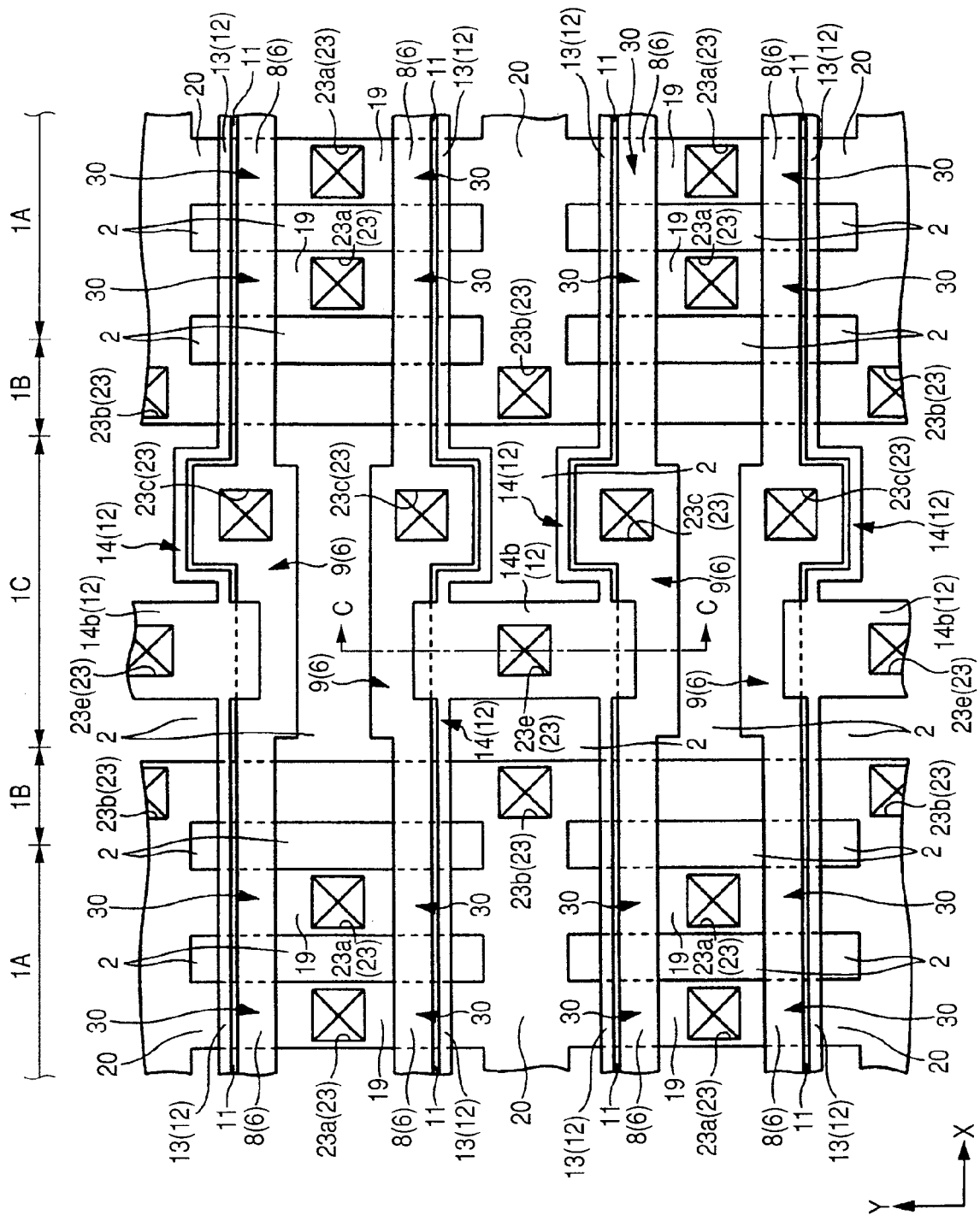
FIG. 8 is a fragmentary plan view of a semiconductor device showing a first comparative example.
Figure 9:
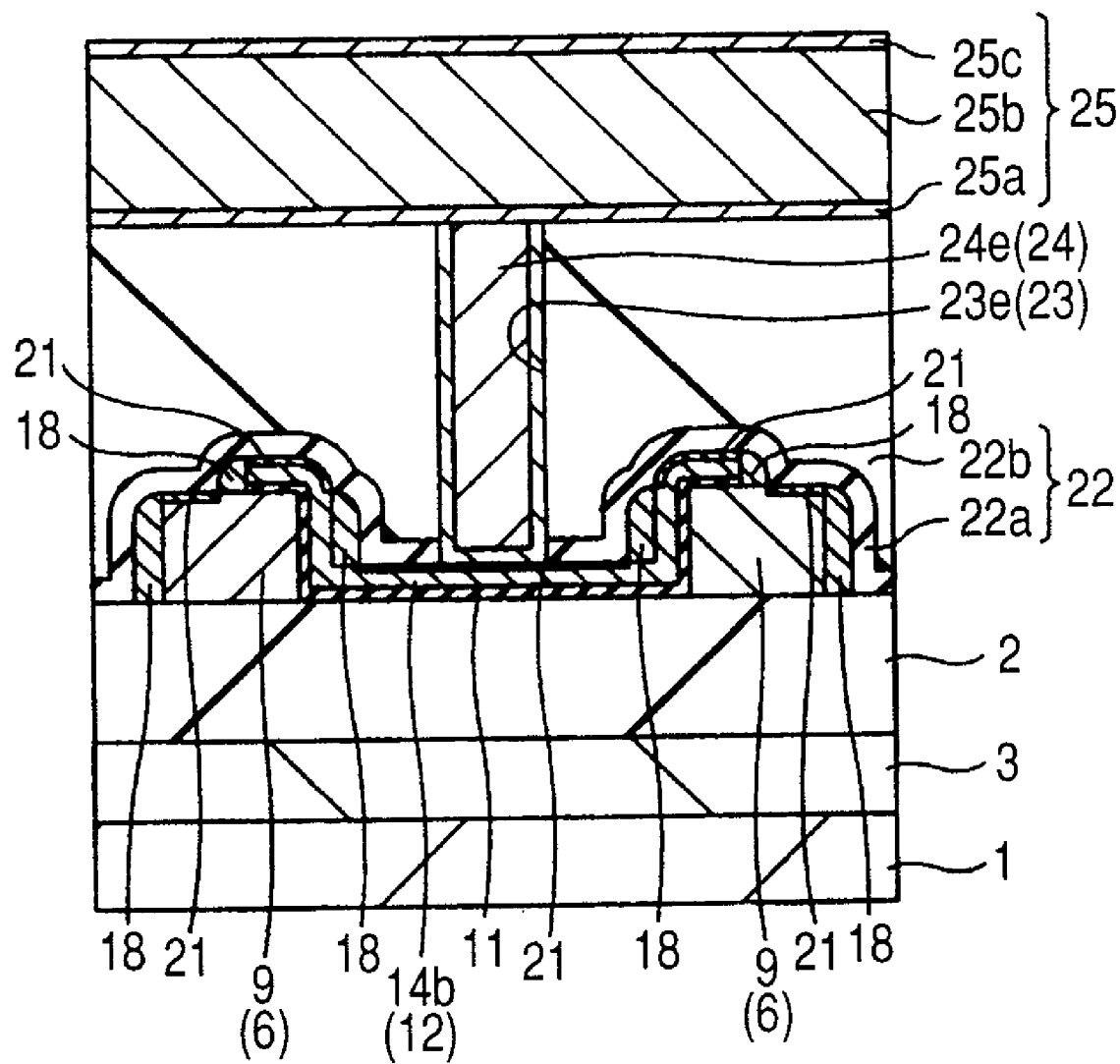
FIG. 9 is a fragmentary sectional view of the semiconductor device illustrating the first comparative example.

FIG. 8 is a fragmentary plan view of a semiconductor device (nonvolatile semiconductor memory device) showing a first comparative example discussed by the present inventors. FIG. 9 is a fragmentary sectional view thereof. A sectional view taken along line C-C of FIG. 8 corresponds to FIG. 9. Also FIG. 8 is a plan view corresponding to FIG. 1 referred to above.

The semiconductor device showing the first comparative example shown in FIGS. 8 and 9 is different from the semiconductor device according to the present embodiment in terms of pattern shapes of select gate lines 9 and memory gate lines 14, positions of contact holes 23e connected to the memory gate lines 14 and plugs 24e that bury them, and a relationship of connection between wirings 25 connected to the plugs 24e and the memory gate lines 14. Since a sectional structure of each memory cell of the semiconductor device according to the first comparative example is similar to that of FIG. 2 of the first embodiment, its explanation will be omitted herein.

In the semiconductor device of the first comparative example shown in FIGS. 8 and 9, in a manner similar to the present embodiment, the select gate lines 9 comprises patterned polycrystalline silicon films 6 and respectively have first portions 9a that connect select gate electrodes 8 of memory cells 30 extending in an X direction (corresponding to the X direction of FIG. 1) of FIG. 8 and arranged in the X direction, and wide portions 9c each relatively broad in width at the first portion 9a. However, the select gate lines 9 are not provided with the second portions 9b unlike the present embodiment.

In the semiconductor device of the first comparative example shown in FIGS. 8 and 9, each of the memory gate lines 14 each constituted of a polycrystalline silicon film 12 is formed over one sidewall of each of the select gate lines 9 with an insulating film 11 interposed therebetween. The memory gate lines 14 adjacent to one another through a source region 20 in a Y direction are electrically connected to one another by contact sections 14b each made up of some of the polycrystalline silicon films 12 that constitute the memory gate lines 14. The contact sections 14b extend in the Y direction (corresponding to the Y direction of FIG. 1) of FIG. 8 from over the select gate lines 9 to over the other select gate lines 9, and electrically connect the memory gate lines 14 provided over the sidewalls of the select gate lines 9 and other memory gate lines 14 provided over the sidewalls of the other select gate lines 9, respectively.

The polycrystalline silicon films 12 formed over a semiconductor substrate 1 so as to cover patterned polycrystalline silicon films 6 that constitute the select gate electrodes 8 and the select gate lines 9 are anisotropically etched to allow the polycrystalline silicon films 12 to remain on one sidewalls of the patterned polycrystalline silicon films 6 with the insulating films 11 interposed therebetween. Consequently, the corresponding memory gate electrodes 13 and memory gate lines 14 each formed of the polycrystalline silicon film 12 can be formed. On the other hand, however, an etching mask layer (photoresist layer not shown) is formed over the contact sections 14b and the polycrystalline silicon films 12 placed below the etching mask layer are caused to remain in the process of anisotropically etching the polycrystalline silicon films 12, whereby the contact sections 14b of the memory gate lines 14 are formed. Thus, the plan pattern shape of the etching mask layer (photoresist layer) used at this time corresponds to that of each contact section 14b.

The contact hole 23e is formed over its corresponding contact section 14b of the memory gate line 14. The plug 24e is connected to its corresponding contact section 14b of the memory gate line 14 at the bottom of the contact hole 23e. The plug 24e is connected to the wiring 25 and a plurality of the memory gate lines 14 are electrically connected through the plugs 24e and wirings 25. Thus, in the first comparative example, the two memory gate lines 14 (memory gate electrodes 13) adjacent to each other in the Y direction through the source region 20 interposed therebetween are taken out (led out) by the common contact section 14b and the plug 24e connected thereto.

Figure 10:
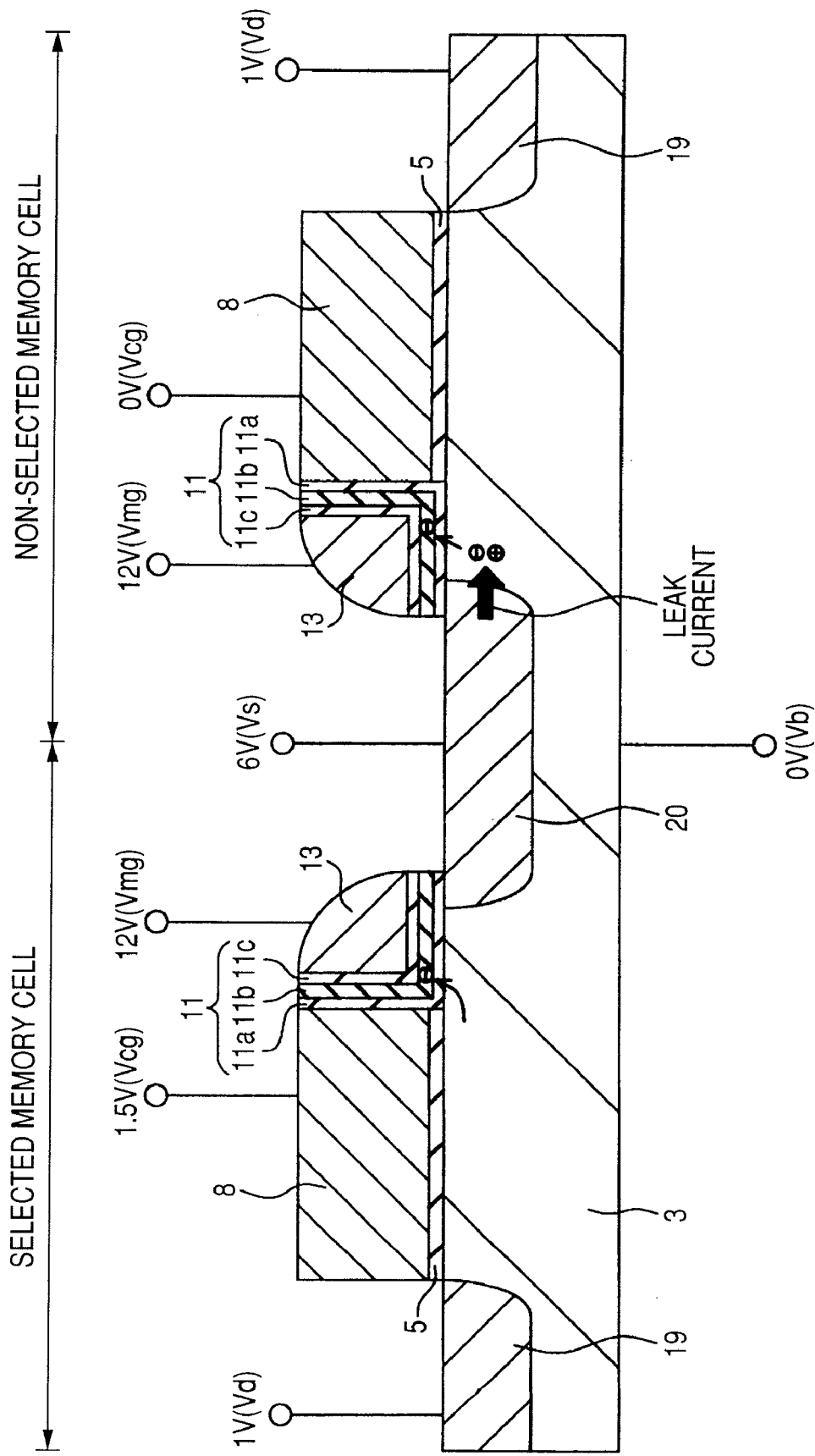
FIG. 10 is an explanatory view showing problems at a write operation in the semiconductor device of the first comparative example.

FIG. 10 is an explanatory view showing problems at a write operation in the semiconductor device of the first comparative example.

In the semiconductor device of the first comparative example shown in FIGS. 8 and 9, such voltages as shown in the column of "write" of FIG. 5 are applied to respective portions of the corresponding selected memory cell to be written of the memory cells 30 upon the write operation. In the selected memory cell, 1V is applied to the drain region 19 as Vd, 1.5V (Vdd) is applied to the select gate electrode 8 (select gate line 9) as Vcg, 12V is applied to the memory gate electrode 13 (memory gate line 14) as Vmg, and 6V is applied to the source region 20 as Vs. In the selected memory cell and a non-selected memory cell (memory cell on which no writing is performed) that adjoin (is adjacent to) the selected memory cell in the Y direction through the source region 20 interposed therebetween, the source region 20 is common and the memory gate lines 14 are electrically connected to each other at the contact section 14b. Therefore, the potential Vs of the source region 20 becomes the same potential because the source region 20 is common in the selected memory cell and the non-selected memory cell adjacent to the selected memory cell in the Y direction with the source region 20 interposed therebetween. Since the memory gate lines 14 are connected to each other at the contact section 14b, the potentials Vmg of the memory gate electrodes 13 (memory gate lines 14) become the same potential. Thus, when the write voltage is applied to the selected memory cell, the same voltages (Vs=6V and Vmg=12V) as the selected memory cell are applied to the source region 20 of the non-selected memory cell and the memory gate electrode 13 (memory gate line 14).

Therefore, a channel current is cut off by the potential Vcg of the select gate electrode 8 (select gate line 9) of the non-selected memory cell adjacent to the selected memory cell to be written in the Y direction with the source region 20 interposed therebetween, thereby to prevent disturb of the non-selected memory cell. Since, however, a high voltage similar to the selected memory cell is actually applied to the source region 20 and memory gate electrode 13 in the non-selected memory cell adjacent to the selected memory cell to be written in the Y direction through the source region 20 as shown in FIG. 10 and in the above, a junction leak current occurs between the source and substrate and hot electrons generated with its occurrence are captured into the corresponding insulating film 11 (silicon nitride film 11b thereof) of the non-selected memory cell, thus causing the possibility that the threshold voltage of a memory transistor for the non-selected memory cell will rise. Thus, the write disturb applied to the non-selected memory cell adjacent to the writing selected memory cell in the Y direction through the source region 20 becomes a problem. This causes the possibility that the performance of the semiconductor device will be degraded.

In the present embodiment in contrast, the memory gate lines 14 respectively connected to the memory gate electrodes 13 of the memory cells 30, which adjoin (are opposite and adjacent to one another) in the Y direction with the source regions 20 interposed therebetween, i.e., the memory gate lines 14 adjacent to one another in the Y direction with the source regions 20 interposed therebetween are not electrically connected to one another as mentioned above. Further, the voltages (different voltages) can independently be applied thereto through the different wirings 25d and plugs 24d. Thus, in the present embodiment, the two memory gate lines 14 (memory gate electrodes 13) adjacent to each other in the Y direction with the source region 20 interposed therebetween are respectively independently be taken out (led out) by the contact sections 14a of the respective memory gate lines 14 and the plugs 24d connected thereto. Therefore, the selected memory cell intended for writing, of the memory cells 30 and the non-selected memory cell adjacent to the selected memory cell in the Y direction with the source region 20 interposed therebetween make it possible to independently apply (supply) predetermined (desired) voltages to the memory gate electrodes 13. Thus, different potentials can be applied (supplied) to the memory gate electrode 13 of the selected memory cell on which writing is performed, and the memory gate electrode 13 of the non-selected memory cell adjacent to the selected memory cell in the Y direction with the source region 20 interposed therebetween.

Therefore, in the present embodiment, even though such voltages as shown in the column of "write" of FIG. 5 are applied to the respective portions of the selected memory cell intended for writing upon a write operation, the value of the voltage applied to the memory gate electrode 13 in the non-selected memory cell adjacent to the selected memory cell in the Y direction with the source region 20 interposed therebetween can be made different from the value of the voltage applied to the memory gate electrode 13 of the selected memory cell. For example, the voltage Vmg of the memory gate electrode 13 of the non-selected memory cell adjacent to the writing selected memory cell in the Y direction with the source region 20 interposed therebetween can be made lower than the voltage Vmg (12V in the example of FIG. 5) of the memory gate electrode 13 of the writing selected memory cell (the former voltage is set to, for example, 0V or 1.5V or the like as Vdd). That is, in the present embodiment, the value of a voltage applied to a word line (memory gate electrode 13) of a selected memory cell intended for writing, of at least two memory cells (corresponding to the memory cells 30a and 30b, for example) connected to a common source line and disposed adjacent to each other so as to be opposed to the source line is rendered different from the value of a voltage applied to a word line (memory gate line 13) of the non-selected memory cell unintended for writing upon write operations of the memory cells. More preferably, the value of the voltage applied to the word line (memory gate electrode 13) of the selected memory cell is made greater than the value of the voltage applied to the word line (memory gate electrode 13) of the non-selected memory cell. It is thus possible to apply the high voltage to the memory gate electrode 13 of the writing selected memory cell and avoid the application of the high voltage to the memory gate electrode 13 of the non-selected memory cell adjacent to the writing selected memory cell in the Y direction with the source region 20 interposed therebetween.

Thus, the present embodiment is different from the first comparative example in that since no high voltage is applied to the memory gate electrode 13 of the non-selected memory cell adjacent to the selected memory cell to be written in the Y direction with the source region 20 interposed therebetween, it is possible to prevent electrons from being captured into the insulating film 11 (silicon nitride film 11b thereof) of the non-selected memory cell, and prevent the phenomenon that the threshold voltage of the memory transistor of the non-selected memory cell. Thus, the present embodiment is capable of preventing write disturb applied to the non-selected memory cell adjacent to the write selected memory cell in the Y direction with the source region 20 interposed therebetween.

Figure 11:
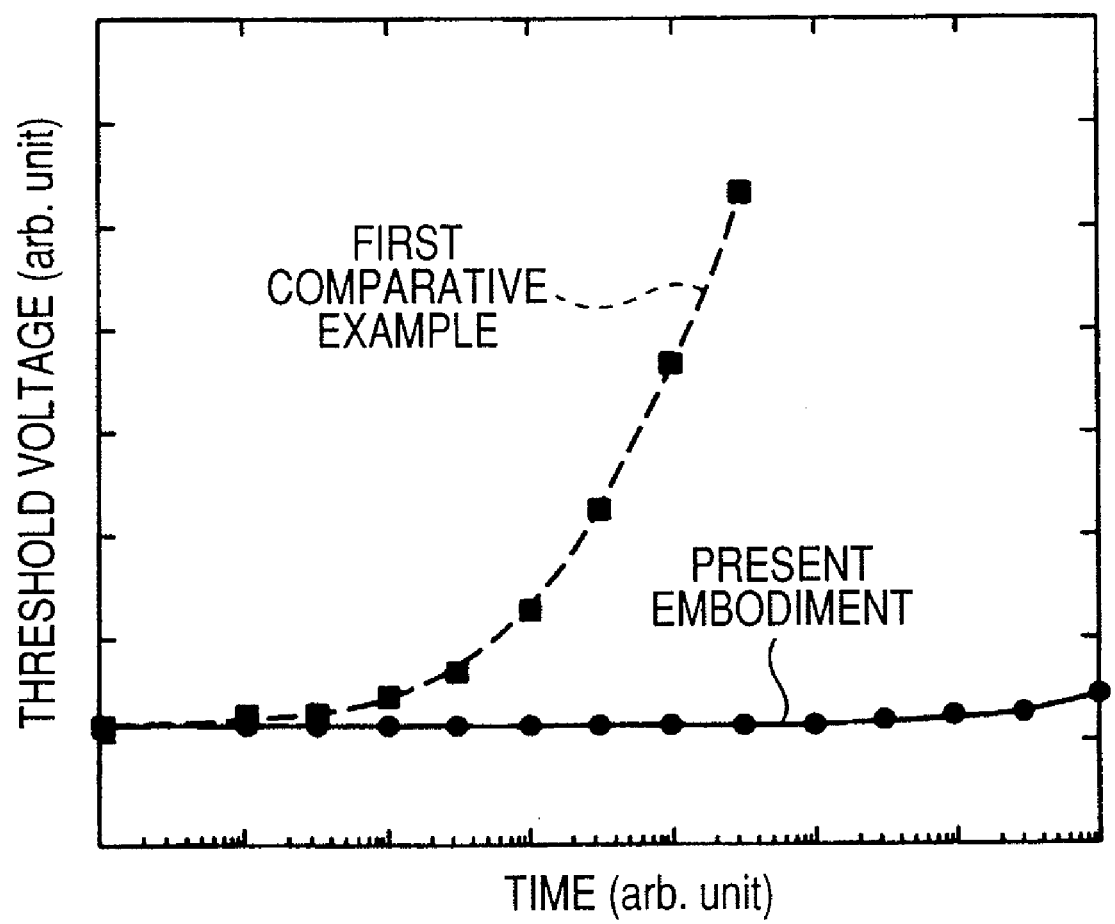
FIG. 11 is a graph illustrating write disturb of a non-selected memory cell at the operation of writing into the selected memory cell.

FIG. 11 is a graph showing write disturb of a non-selected memory cell at the operation of writing into a selected memory cell. The horizontal axis of FIG. 11 corresponds to time (arbitrary unit) subsequent to the application of a writing voltage, whereas the vertical axis of FIG. 11 corresponds to a threshold voltage (arbitrary unit) of the non-selected memory cell adjacent to the selected memory cell intended for writing in the Y direction with the source region 20 interposed therebetween. A case (indicated by a solid line as "present embodiment" in the graph of FIG. 11) corresponding to the semiconductor device according to the present embodiment such as shown in FIGS. 1 through 3 and a case (indicated by a dotted line as "first comparative example" in the graph of FIG. 11) corresponding to the first comparative example such as shown in FIGS. 8 and 9 are shown in the graph of FIG. 11.

In the first comparative example as shown in the graph of FIG. 11, upon a write operation, a high voltage is applied to each of the source region 20 and the memory gate electrode 13 in the non-selected memory cell adjacent to the writing selected memory cell in the Y direction with the source region 20 interposed therebetween. Therefore, electrons (hot electrons) are captured into the insulating film 11 (silicon nitride film 11b thereof) of the non-selected memory cell and hence the threshold voltage of the memory transistor for the non-selected memory cell rises. In the present embodiment in contrast, no high voltage is applied to the memory gate electrode 13 upon a write operation in the non-selected memory cell adjacent to the writing selected memory cell in the Y direction with the source region 20 interposed therebetween. Therefore, no electrons (hot electrons) are captured into the insulating film 11 (silicon nitride film 11b thereof) of the non-selected memory cell and hence the threshold voltage of the memory transistor for the non-selected memory cell almost remains unchanged.

Thus, in the present embodiment, the memory gate lines 14 (memory gate electrodes 13) adjacent to each other in the Y direction with the source region 20 interposed therebetween are not electrically connected to each other. The desired potentials (different potentials) can independently be supplied to the two memory gate lines 14 (memory gate electrodes 13), respectively, adjacent to each other with the source region 20 interposed therebetween. It is therefore possible to prevent the application of the high voltage to the memory gate electrode 13 in the non-selected memory cell adjacent to the writing selected memory cell with the source region 20 interposed therebetween and prevent a change (rise) in the threshold voltage of the memory transistor for the non-selected memory cell. Thus, the performance of the semiconductor device can be enhanced.

Figure 12:
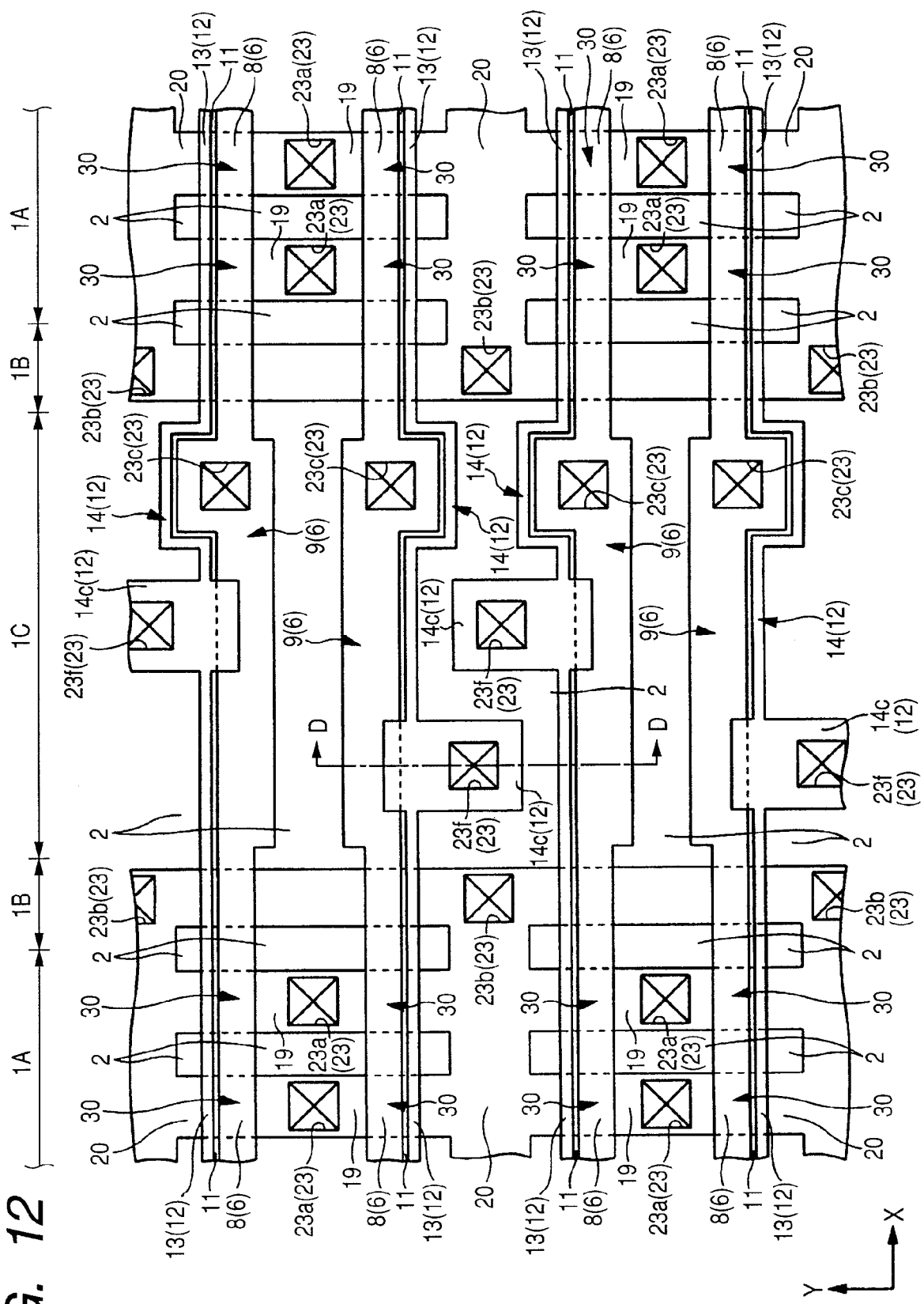
FIG. 12 is a fragmentary plan view of a semiconductor device showing a second comparative example.
Figure 13:
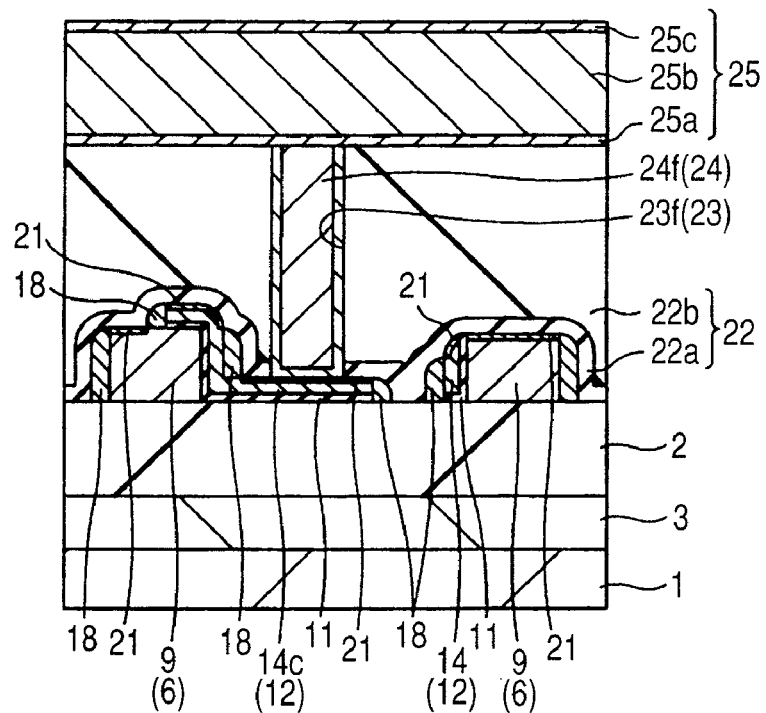
FIG. 13 is a fragmentary sectional view of the semiconductor device showing the second comparative example.

FIG. 12 is a fragmentary plan view of a semiconductor device (nonvolatile semiconductor memory device) showing a second comparative example discussed by the present inventors, and FIG. 13 is a fragmentary sectional view thereof, respectively. A sectional diagram taken along line D-D of FIG. 12 corresponds to FIG. 13. FIG. 12 is a plan view corresponding to FIGS. 1 and 8.

The semiconductor device of the second comparative example shown in FIGS. 12 and 13 is different from the semiconductor device according to the present embodiment in terms of pattern shapes of select gate lines 9 and memory gate lines 14 and positions of contact holes 23f connected to the memory gate lines 14 and plugs 24f that bury them. Since a sectional structure of each memory cell of the semiconductor device according to the second comparative example is similar to that of FIG. 2 of the first embodiment, its explanation will be omitted herein.

In the semiconductor device of the second comparative example shown in FIGS. 12 and 13, pattern shapes of polycrystalline silicon films 6 that constitute select gate electrodes 8 and the select gate lines 9 are substantially similar to the first comparative example. That is, the pattern shapes of the select gate lines 9 are substantially similar to the first comparative example. The select gate lines 9 respectively have first portions 9a that connect the select gate electrodes 8 of memory cells 30 extending in an X direction (corresponding to the X direction of FIG. 1) of FIG. 12 and arranged in the X direction, and wide portions 9c each relatively broad in width at the first portion 9a. However, the select gate lines 9 are not provided with the second portions 9b unlike the present embodiment. In the semiconductor device of the second comparative example, each of the memory gate lines 14 each constituted of a polycrystalline silicon film 12 is formed on one sidewall of each of the select gate lines 9 with an insulating film 11 interposed therebetween. However, the memory gate lines 14 do not include such contact sections 14b as shown in the first comparative example unlike the first comparative example. Hence the memory gate lines 14 adjacent to each other in the Y direction with a source region 20 interposed therebetween are not electrically connected to each other.

In the semiconductor device of the second comparative example shown in FIGS. 12 and 13, each of the memory gate lines 14 has a contact section 14c that extends in a Y direction (corresponding to the Y direction of FIG. 1) of FIG. 12 from over the select gate line 9 adjacent to the memory gate line 14 with the corresponding insulating film 11 interposed therebetween to over an element isolation region 2. The contact section 14c of the memory gate line 14 is not connected to other memory gate lines 14 adjacent to the memory gate line 14 in the Y direction with the source region 20 interposed therebetween. Thus, the memory gate lines 14 are respectively provided with the independent contact sections 14c.

The polycrystalline silicon films 12 formed over a semiconductor substrate 1 so as to cover the patterned polycrystalline silicon films 6 that constitute the select gate electrodes 8 and the select gate lines 9 are anisotropically etched to allow the polycrystalline silicon films 12 to remain on one sidewalls of the patterned polycrystalline silicon films 6 with the insulating films 11 interposed therebetween. Consequently, the corresponding memory gate electrodes 13 and memory gate lines 14 each formed of the polycrystalline silicon film 12 can be formed. On the other hand, however, an etching mask layer (photoresist layer not shown) is formed over the contact sections 14c and the polycrystalline silicon films 12 placed below the etching mask layer are caused to remain in the process of anisotropically etching the polycrystalline silicon films 12, whereby the contact sections 14c for the select gate lines 9 are formed. Thus, the plan pattern shape of the etching mask layer (photoresist layer) used at this time corresponds to that of each contact section 14c.

The contact holes 23f are formed over their corresponding contact sections 14c of the memory gate lines 14 employed in the semiconductor device of the second comparative example. The plugs 24f are connected to their corresponding contact sections 14c of the memory gate lines 14 at the bottoms of the contact holes 23f. The plugs 24f are connected to their corresponding wirings 25.

In the semiconductor device of the second comparative example shown in FIGS. 12 and 13 in a manner similar to the present embodiment, the memory gate lines 14 adjacent to each other in the Y direction with the source region 20 interposed therebetween are not electrically connected to each other. Desired voltages (different voltages) can independently be applied to the memory gate lines via the different wirings 25 and plugs 24f. Therefore, upon a write operation, even the semiconductor device of the second comparative example is capable of preventing the application of a high voltage to the memory gate electrode 13 in a non-selected memory cell adjacent to a writing selected memory cell in the Y direction with the corresponding source region 20 interposed therebetween and prevent a change (rise) in the threshold voltage of a memory transistor for the non-selected memory cell, in a manner similar to the present embodiment.

However, the semiconductor device of the second comparative example shown in FIGS. 12 and 13 are different from the semiconductor device according to the present embodiment in that the select gate lines 9 are not provided with the second portions 9b respectively and the contact sections 14c of the memory gate lines 14 extend in the Y direction of FIG. 12. Therefore, a margin for alignment and a margin for a variation in size in a photolithography process concentrate on the Y direction of FIG. 12 alone in the case of a plane layout of the semiconductor device of the second comparative example shown in FIGS. 12 and 13. Thus, there is a possibility that it will be hard to sufficiently ensure a process margin and the production yields of the semiconductor device will be degraded. Attempting to sufficiently ensure the process margin in order to prevent the degradation of the manufacturing yields of the semiconductor device will incur upsizing of the semiconductor device (a great increase in the area of the plane layout). In the semiconductor device of the second comparative example, for example, margins for a photolithography process for patterning the polycrystalline silicon film 6 to form the select gate electrodes 8 and the select gate lines 9, a photolithography process for forming the contact sections 14c upon anisotropically etching the polycrystalline silicon film 12 to form the memory gate electrodes 13 and the memory gate lines 14, a photolithography process for forming the contact holes 23f, etc. are stacked on one another only in the Y direction of FIG. 12.

In the semiconductor device according to the present embodiment shown in FIGS. 1 through 3 in contrast, the select gate lines 9 respectively have the second portions 9b that extend in the Y direction of FIG. 1, and the contact sections 14a of the memory gate lines 14 respectively extend in the X direction of FIG. 1 from over the second portions 9b of the select gate lines 9 to over the element isolation region 2.

That is, in the present embodiment, the select gate lines 9 respectively have not only the first portions 9a that connect the select gate electrodes 8 of the respective memory cells 30 extending in the X direction of FIG. 1 and arranged in the X direction to one another and the wide portions 9c at which the widths of the first portions 9a are relatively broad and on which the contact holes 23c are formed, but also the second portions 9b which are respectively connected to the first portions 9a extending in the X direction of FIG. 1 and extend in the Y direction (the direction orthogonal to the X direction) of FIG. 1. Accordingly, the second portions 9b of the select gate lines 9 have one ends connected to the first portions 9a and extend in the direction (Y direction) substantially orthogonal to the extending direction (X direction) of the first portions 9a. While the memory gate lines 14 each formed of the polycrystalline silicon film 12 are formed over their corresponding sidewalls of both the first portions 9a of the select gate lines 9 and the wide portions 9c of the second portions 9b, the memory gate lines 14 respectively have the contact sections 14a that extend in the X direction of FIG. 1 from over the second portions 9b of the select gate lines 9 to over the element isolation region 2.

In the present embodiment, the select gate lines 9 respectively have the second portions 9b that extend in the Y direction of FIG. 1. The contact sections 14a of the memory gate lines 14 are respectively formed so as to extend in the X direction of FIG. 1 from over the second portions 9b of the select gate lines 9 to over the element isolation region 2. Therefore, a margin for alignment and a margin for a size variation in a photolithography process are dispersed into the X and Y directions of FIG. 1 and a process margin is easily ensured sufficiently. Therefore, the production yields of the semiconductor device can be enhanced. It is also possible to improve the reliability and performance of the semiconductor device. When the margin for alignment and the margin for the size variation in the photolithography process concentrate on the Y direction of FIG. 1 alone as in the second comparative example, there is a need to make relatively large the interval between the memory gate lines 13 adjacent to each other in the Y direction. Since, however, the margin for alignment and the margin for the size variation in the photolithography process can be dispersed into the X and Y directions of FIG. 1 in the present embodiment, the interval between the memory gate lines 13 adjacent to each other in the Y direction can be made relatively small, thus leading to the advantage of reducing the area of a plane layout. Thus, the semiconductor device can be made small-sized. It is also possible to improve the production yields of the semiconductor device. In the nonvolatile semiconductor memory device, there is an allowance for space as viewed in the X direction corresponding to the direction of each word line, and there is no allowance for space as viewed in the Y direction corresponding to the direction of each bit line. Therefore, the contact sections 14a of the memory gate lines 14 are caused to extend in the X direction in which there is relatively an allowance for space as in the present embodiment, rather than allowing the contact sections 14c of the memory gate lines 14 to extend in the Y direction in which there is no allowance for space as in the second comparative example. Consequently, the production yields of the semiconductor device can be enhanced and a reduction in the entire layout area of the nonvolatile semiconductor memory device is also enabled.

Figure 14:
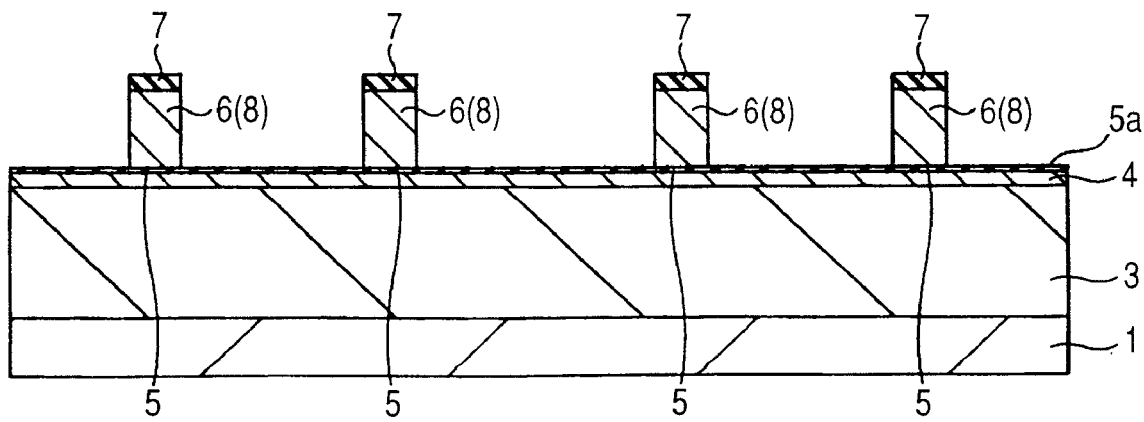
FIG. 14 is a fragmentary sectional view in the process of manufacturing the semiconductor device according to the first embodiment of the present invention.
Figure 15:
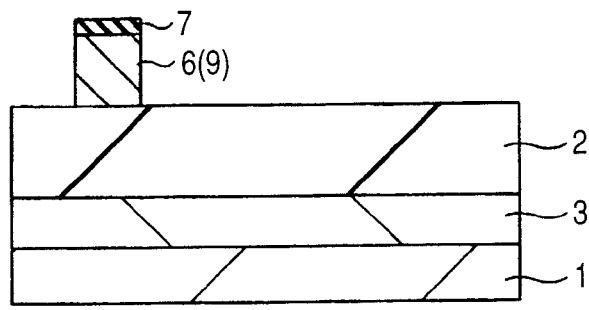
FIG. 15 is a fragmentary sectional view in the process of manufacturing the semiconductor device according to the first embodiment of the present invention.
Figure 16:
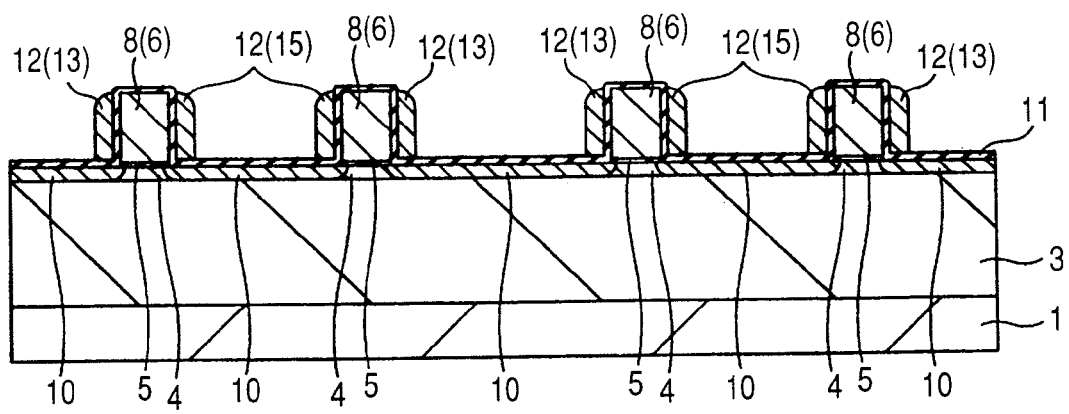
FIG. 16 is a fragmentary sectional view in the process of manufacturing the semiconductor device, following FIG. 14.
Figure 17:
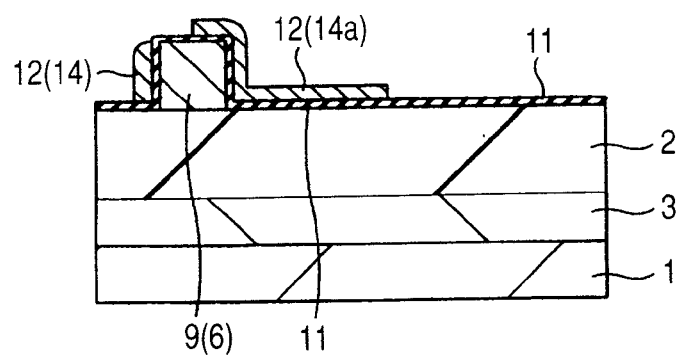
FIG. 17 is a fragmentary sectional view in the process of manufacturing the semiconductor device, following FIG. 15.
Figure 18:
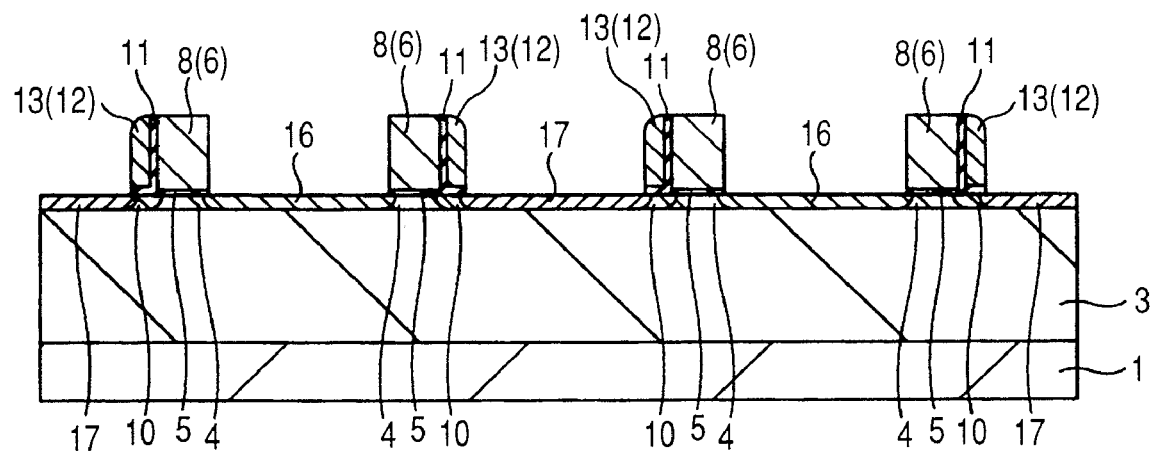
FIG. 18 is a fragmentary sectional view in the process of manufacturing the semiconductor device, following FIG. 16.
Figure 19:
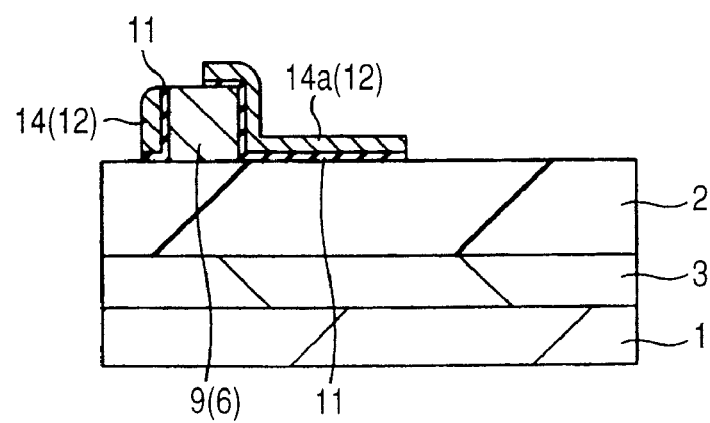
FIG. 19 is a fragmentary sectional view in the process of manufacturing the semiconductor device, following FIG. 17.
Figure 20:
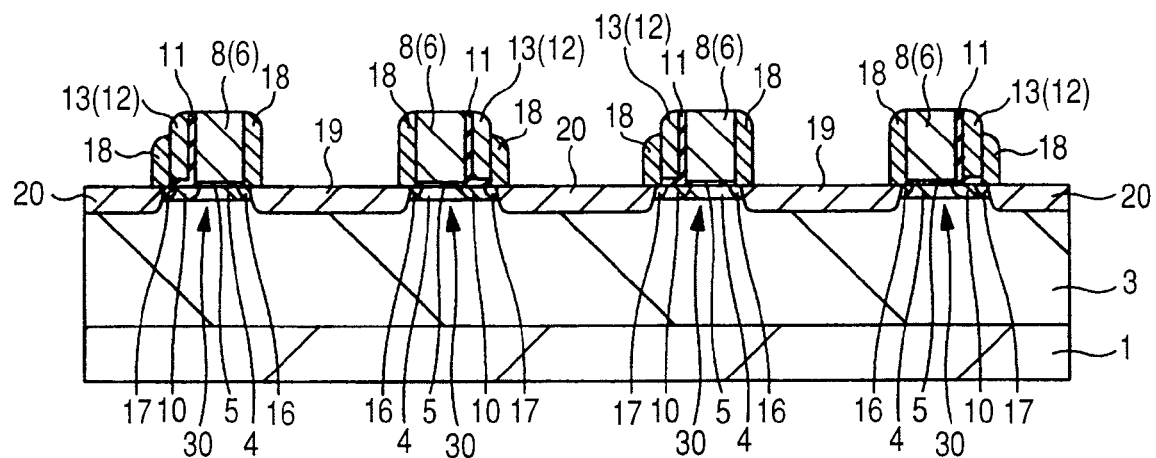
FIG. 20 is a fragmentary sectional view in the process of manufacturing the semiconductor device, following FIG. 18.
Figure 21:
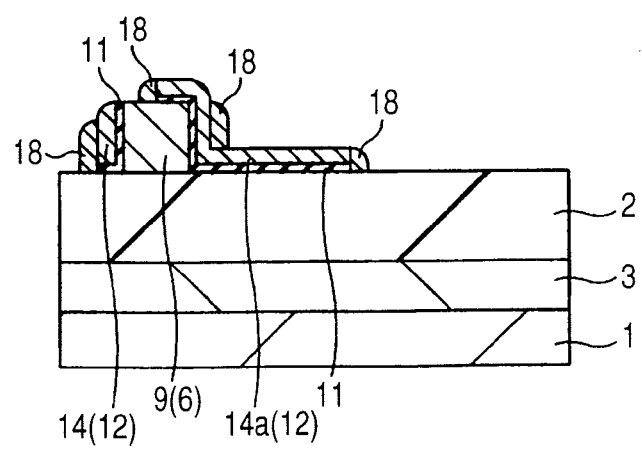
FIG. 21 is a fragmentary sectional view in the process of manufacturing the semiconductor device, following FIG. 19.
Figure 22:
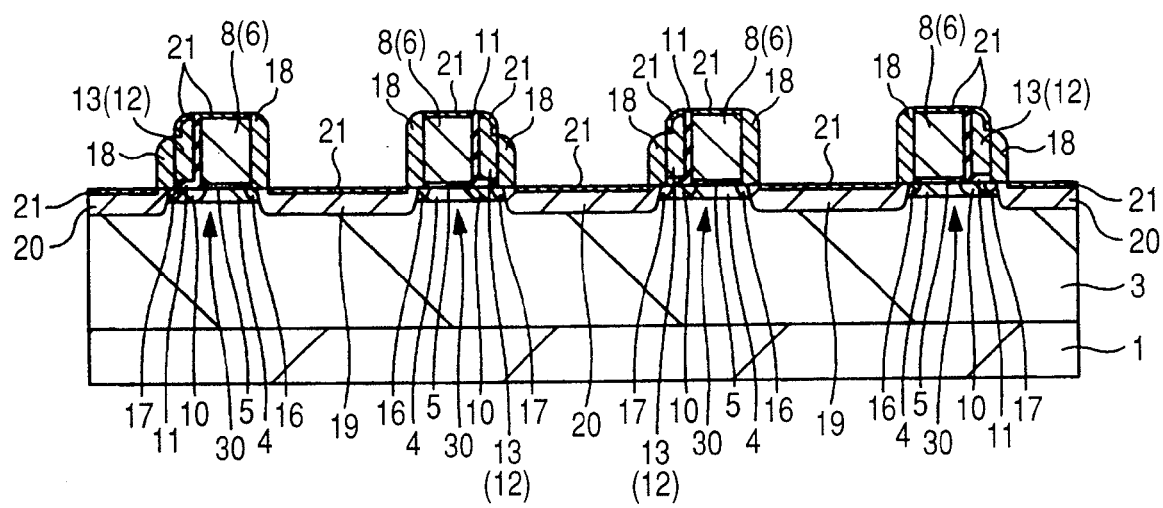
FIG. 22 is a fragmentary sectional view in the process of manufacturing the semiconductor device, following FIG. 20.
Figure 23:
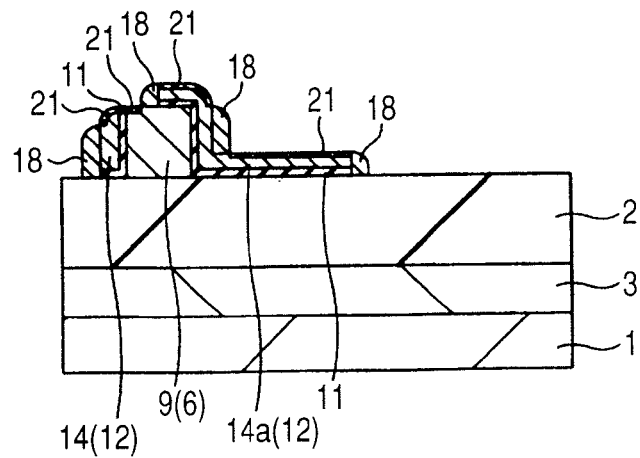
FIG. 23 is a fragmentary sectional view in the process of manufacturing the semiconductor device, following FIG. 21.
Figure 24:
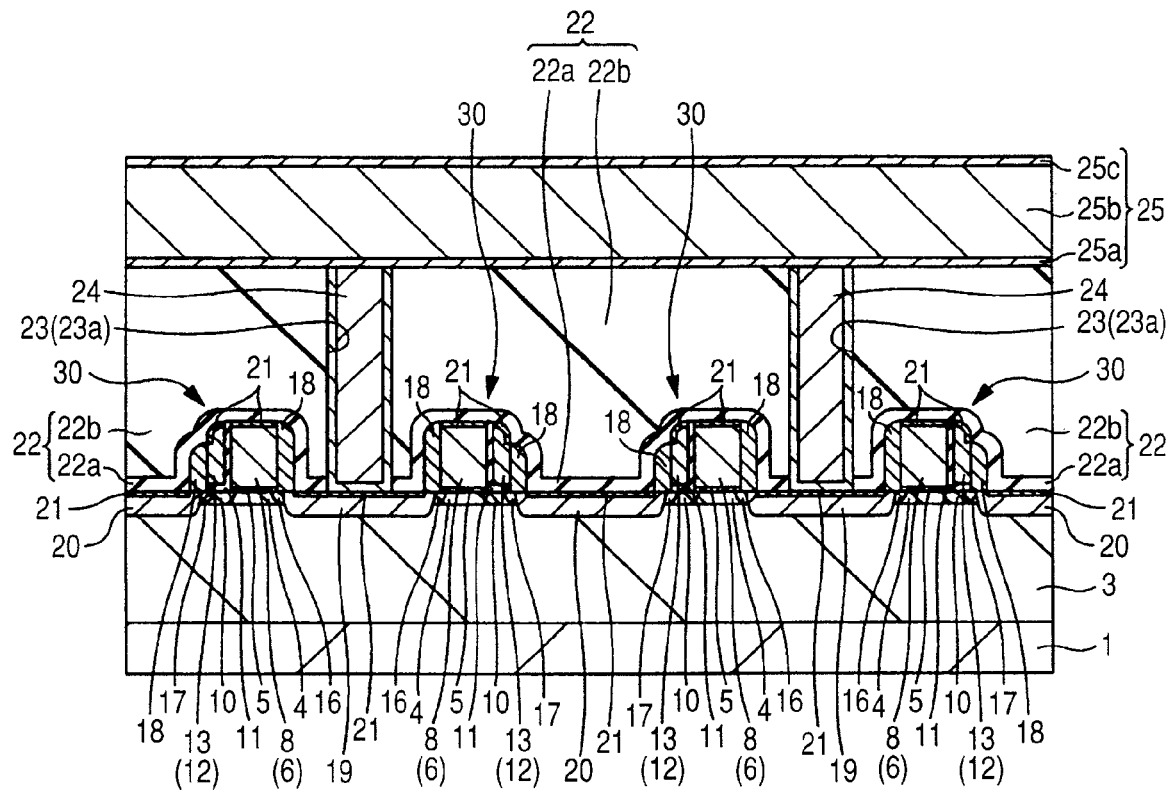
FIG. 24 is a fragmentary sectional view in the process of manufacturing the semiconductor device, following FIG. 22.
Figure 25:
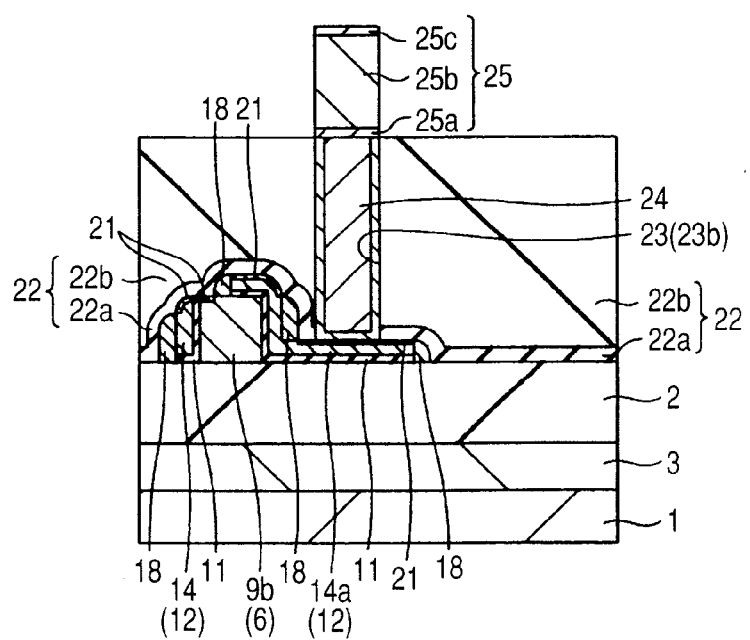
FIG. 25 is a fragmentary sectional view in the process of manufacturing the semiconductor device, following FIG. 23.

A process for manufacturing the semiconductor device (nonvolatile semiconductor memory device) according to the present embodiment will next be explained with reference to the accompanying drawings. FIGS. 14 through 25 are respectively fragmentary sectional views being in the manufacturing process of the semiconductor device (nonvolatile semiconductor memory device) according to the present embodiment. Of FIGS. 14 through 25, FIGS. 14, 16, 18, 20, 22 and 24 are respectively sectional views of regions each corresponding to FIG. 2, and FIGS. 15, 17, 19, 21, 23 and 25 are respectively sectional views of regions each corresponding to FIG. 3. FIGS. 14 and 15 are respectively sectional views being in the same manufacturing process, FIGS. 16 and 17 are respectively sectional views being in the same manufacturing process, FIGS. 18 and 19 are respectively sectional views being in the same manufacturing process, FIGS. 20 and 21 are respectively sectional views being in the same manufacturing process, FIGS. 22 and 23 are respectively sectional views being in the same manufacturing process, and FIGS. 24 and 25 are respectively sectional views being in the same manufacturing process.

As shown in FIGS. 14 and 15, a semiconductor substrate (semiconductor wafer) 1 comprising p-type monocrystalline silicon or the like having specific resistivity ranging from approximately 1 to 10 $\Omega$cm, for example, is first prepared. Then, an element isolation region 2 comprising an insulator is formed over a main surface of the semiconductor device 1 by, for example, an STI (Shallow Trench Isolation) method or the like.

Next, a p-type impurity is ion-implanted to form a p-type well 3. The p-type well 3 is principally formed in a memory cell region or area 1A. The memory cell region 1A is electrically isolated from other region by the element isolation region 2. Then, a p-type semiconductor region (p-type impurity region and channel region) 4 for adjusting the threshold voltage of a selection transistor is formed in a surface portion (surface layer portion) of the p-type well 3 by an ion implantation method or the like.

Next, the surface of the semiconductor substrate 1 is subjected to cleaning processing and thereafter an insulating film 5a for a gate insulating film of each selection transistor is formed over the surface of the p-type well 3 by a thermal oxidation method or the like. Then, a polycrystalline silicon film 6 formed as select gate electrodes and a silicon oxide film 7 for protection of the select gate electrodes are sequentially deposited over the semiconductor substrate 1 containing a portion above the insulating film 5a. The polycrystalline silicon film 6 is of a polycrystalline silicon film implanted or doped with an n-type impurity (e.g., phosphorus (P) or the like), i.e., an n-type polycrystalline silicon film.

Next, the silicon oxide film 7 and the polycrystalline silicon film 6 are patterned by using photolithography technology and dry etching technology to form select gate electrodes 8 and select gate lines 9 of selection transistors. The select gate electrodes 8 and select gate lines 9 are constituted of the patterned polycrystalline silicon films 6. The insulating film 5a placed below the select gate electrodes 8 result in the gate insulating films 5 for the selection transistors. Thus, the select gate electrodes 8 and select gate lines 14 (first, second and third portions 14a, 14b and 14c) are formed in the same process and comprise conductor layers (polycrystalline silicon films 6) identical in layer. Upon formation of patterns for the select gate electrodes 8 and the select gate lines 9, dry etching is stopped in the stage of exposure of the surface of the insulating film 5a in such a manner that unnecessary damage does not occur in the surface of the semiconductor substrate 1.

Next, as shown in FIGS. 16 and 17, a threshold voltage adjusting p-type semiconductor region (p-type impurity region) 10 is formed in a channel region of each memory transistor of the semiconductor substrate 1 (p-type well 3 thereof) by the ion implantation method or the like.

Next, the insulating film 5a left behind for protection of the semiconductor substrate 1 is removed using, for example, hydrofluoric acid or the like, and thereafter an insulating film 11 used as the gate insulating film for each memory transistor is formed. The insulating film 11 is constituted of a laminated film of, for example, a silicon oxide film (corresponding to the silicon oxide film 11a), a silicon nitride film (corresponding to the silicon nitride film 11b) and a silicon oxide film (corresponding to the silicon oxide film 11c). The insulating film 11 is formed over the surface of the p-type well 3 and the exposed surfaces (sidewalls) of the select gate electrodes 8. Of the insulating film 11, the silicon oxide film can be formed by, for example, an oxidation process (thermal oxidation process), and the silicon nitride film can be formed by, for example, a CVD (Chemical Vapor Deposition) method. It is possible to deposit the silicon nitride film of the insulating film 11 by the CVD method after the formation of the lower silicon oxide film of the insulating film 11 by thermal oxidation and form the upper silicon oxide film of the insulating film 11 by the CVD method and thermal oxidation. Incidentally, the silicon oxide film 7 provided over each select gate electrode 8 can also be removed upon removal of the insulating film 5a.

Next, a polycrystalline silicon film 12 used as each memory gate electrode is deposited over the semiconductor substrate 1 containing the insulating film 11. The polycrystalline silicon film 12 is of a polycrystalline silicon film implanted or doped with an n-type impurity (e.g., Phosphorous (P) or the like), i.e., an n-type polycrystalline silicon film.

Next, the polycrystalline silicon film 12 is removed by anisotropic etching technology until the upper surface of the insulating film is exposed, thereby causing the polycrystalline silicon film 1 to remain over the sidewalls of the select gate electrodes 8 and the select gate lines 9 through the insulating film 11, so that the corresponding memory gate electrodes 13 and memory gate lines 14 are formed. The insulating film placed below each memory gate electrode 13 results in a gate insulating film for each memory transistor. In the process of anisotropically etching the polycrystalline silicon film 12, an etching mask layer (photoresist layer no shown) is formed over the contact sections 14a, and the polycrystalline silicon film 12 placed below the etching mask layer is caused to remain, whereby the contact sections 14a of the select gate lines 9 are formed. Thus, the memory gate electrodes 13, the memory gate lines 9 and the contact sections 14a of the memory gate lines 14 are formed in the same process and comprise conductor layers (polycrystalline silicon film 12) identical in layer. Sidewall spacers 15 each comprising the polycrystalline silicon film 12 are formed even over their corresponding sidewalls of the select gate electrodes 8 on the sides opposite to the memory gate electrodes 13.

Next, as shown in FIGS. 18 and 19, the sidewall spacers 15 are removed by using the photolithography technology and dry etching technology. Then, the upper silicon oxide film of the exposed insulating film 11 and the lower silicon nitride film thereof are removed using, for example, hydrofluoric acid and thermal phosphoric acid or the like.

Next, as shown in FIGS. 20 and 21, a low-concentration n-type impurity is ion-implanted to form low-concentration n-type semiconductor regions 16 at drain sections and form low-concentration n-type semiconductor regions 17 at source sections. Although the low-concentration n-type semiconductor regions 16 at the drain sections and the low-concentration n-type semiconductor regions 17 at the source sections are formed in the same ion-implantation process, they can also be formed by discrete ion-implantation processes using the photolithography technology and a resist film.

Next, the exposed portion of the lower silicon oxide film of the insulating film 11 is removed by, for example, hydrofluoric acid or the like. Thereafter, the silicon oxide film is deposited over the semiconductor substrate 1 and anisotropically etched to form sidewall spacers 18 each formed of an insulator such as silicon oxide over their corresponding sidewalls of the select gate electrode 8, the select gate line 9, the memory gate electrode 13 and the memory gate line 14.

Next, an n-type impurity is ion-implanted to form drain regions (n-type semiconductor region and n-type impurity region) 19 of the selection transistors and source regions (n-type semiconductor region and n-type impurity region) 20 of the memory transistors. Each of the drain regions 19 is higher than the low-concentration n-type semiconductor region 16 at the drain section in impurity concentration, and each of the source regions 20 is higher than the low-concentration n-type semiconductor region 17 at the source section. Thus, memory cells 30 for a flash memory (nonvolatile semiconductor memory device) are formed.

Next, as shown in FIGS. 22 and 23, the surfaces of the select gate electrodes 8, select gate lines 9, memory gate electrodes 13, memory gate lines 14, drain regions 19 and source regions 20 are exposed, and, for example, a cobalt (Co) film is deposited and heat-treated to thereby form a metal silicide film (cobalt silicide film, e.g., $CoSi_2$ film) 21 over their corresponding upper portions (surfaces) of the select gate electrodes 8, select gate lines 9, memory gate electrodes 13, memory gate lines 14, drain regions 19 and source regions 20 respectively. Thus, diffusion resistances and contact resistances can be brought into low resistance form. Thereafter, the unreacted cobalt film is removed.

Next, as shown in FIGS. 24 and 25, an insulating film (interlayer insulating film) 22 is formed over the semiconductor substrate 1. That is, the insulating film 22 is formed over the semiconductor substrate 1 containing over the metal silicide film 21 so as to cover the select gate electrodes 8 and the memory gate electrodes 13. The insulating film 22 is constituted of a laminated film of, for example, relatively thin silicon nitride 22a and relatively thick silicon oxide 22b provided thereon. The insulating film 22 can serve as the interlayer insulating film. As needed, the process of planarizing the upper surface of the insulating film 22 can also be carried out by a CMP (Chemical Mechanical Polishing) method or the like.

Next, the insulating film 22 is dry-etched using the photolithography technology and the dry etching technology to define contact holes 23 in the insulating film 22.

Next, plugs 24 (containing the interiors of plug 24) each made up of tungsten (W) or the like are formed in the contact holes 23. The plugs 24 can be formed by, for example, forming a barrier film (e.g., titanium nitride film) over the insulating film 22 containing the interiors of the contact holes 23, thereafter forming a tungsten film over the barrier film by the CVD method so as to bury the contact holes 23, and removing the unnecessary tungsten film and barrier film placed over the insulating film 22 by CMP or an etchback method or the like.

Next, a wiring (first wiring layer) 25 is formed over the insulating film 22 in which the plugs 24 have been embedded. For example, a barrier conductor film 25a (e.g., titanium film or titanium nitride film or laminated film thereof), an aluminum film 25b and a barrier conductor film 25c (e.g., titanium film or titanium nitride film or laminated film thereof) are sequentially formed over the insulating film 22 with the plugs 24 embedded therein by a sputtering method or the like and patterned by using the photolithography technology and dry etching technology or the like to enable formation of each wiring 25. The wiring 25 is not limited to such an aluminum wiring as described above and can be changed in various ways. The wiring 25 may also be formed as, for example, a tungsten wiring and a copper wiring (e.g., buried copper wiring formed by the damascene method). Although an interlayer insulating film, an upper wiring layer, etc are further formed subsequently, their explanations will be omitted here. Ones subsequent to a second layer wiring may also be configured as a buried copper wiring formed by the damascene method.

Second Preferred Embodiment

Figure 26:
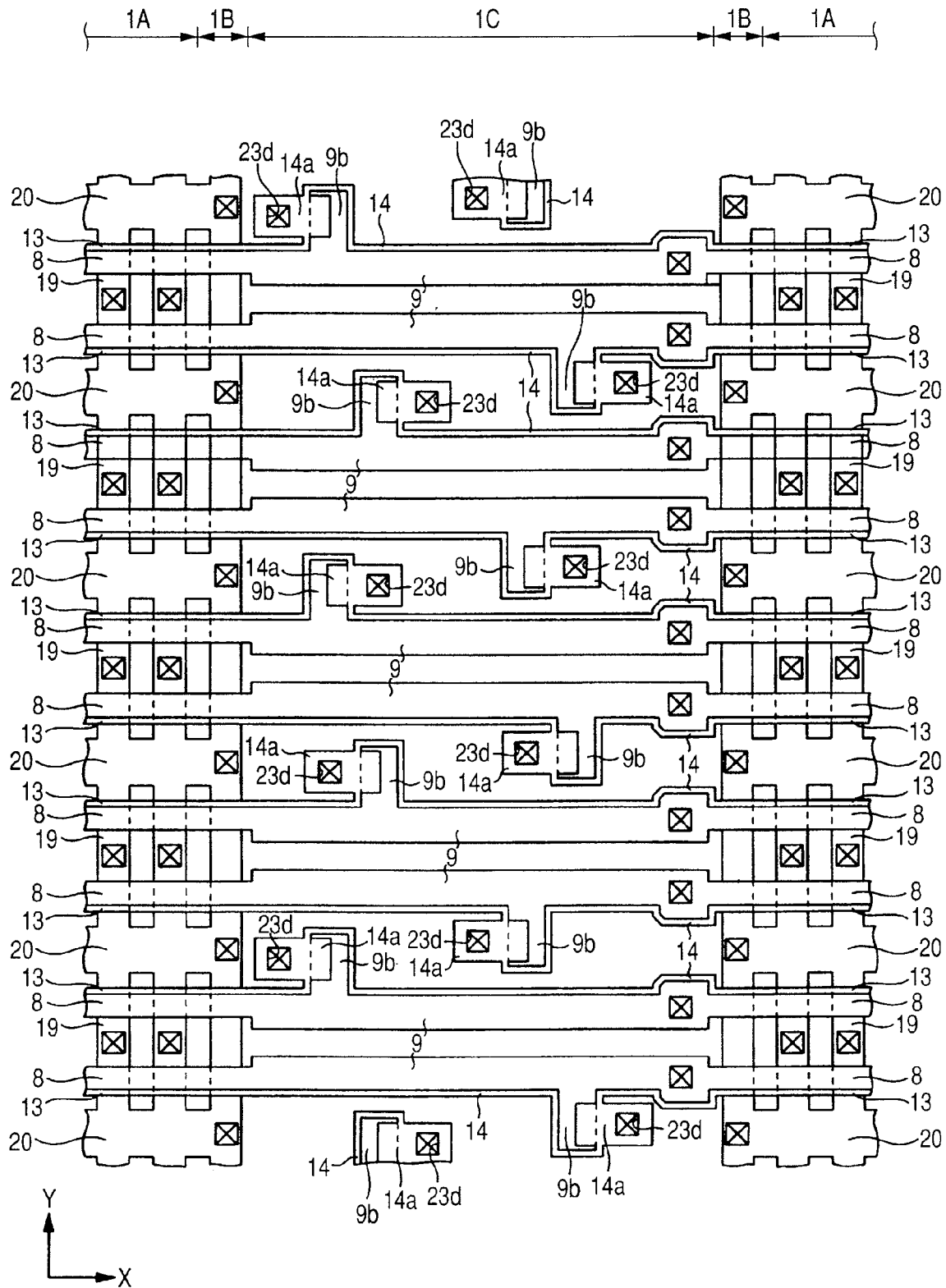
FIG. 26 is a fragmentary plan view of a semiconductor device according to a second embodiment of the present invention.

FIG. 26 is a fragmentary plan view of a semiconductor device (nonvolatile semiconductor memory device) according to a second embodiment of the present invention. FIG. 26 is a plan view substantially corresponding to FIG. 1 of the first embodiment. Since a sectional structure or the like of each memory cell is similar to the first embodiment, its description will be omitted herein.

While the memory gate lines 14 (polycrystalline silicon films 12) have been electrically connected via the wiring 25 and the plugs 23d on alternate lines, memory gate lines 14 (polycrystalline silicon films 12) are electrically connected to one another via the wirings 25 and plugs 23d at intervals of seven lines in the semiconductor device of the present embodiment shown in FIG. 26. That is, other seven memory gate lines 14 exist between the memory gate lines 14 electrically connected to one another.

In the semiconductor device shown in FIG. 26, the positions of second portions 9b of select gate lines 9, and the positions of contact sections 14a of the memory gate lines 14 placed over the sidewalls of the select gate lines 9 are shifted respectively to thereby shift X-direction positions of contact holes 23d opened over the contact sections 14a of the respective memory gate lines 14. Thus, the connected positions of the contact sections 14a of the memory gate lines 14 adjacent to each other in a Y direction and their corresponding plugs 24d are shifted in an X direction. The positions in the X direction, of connecting portions of the contact sections 14a of the memory gate lines 14 and their corresponding plugs 24d are made identical at nth, and n+8th to n+8mth (where n and m: integers) memory gate lines 14. The nth and n+8th to n+8mth memory gate lines 14 are electrically connected to one another by the same wirings 25 extending in the Y direction. By shifting the positions of the second portions 9b of the respective select gate lines 9, and the positions of the contact sections 14a of the memory gate lines 14 placed over the sidewalls of the select gate lines 9 respectively and shifting the X-direction positions of the contact holes 23d opened over the contact sections 14a of the respective memory gate lines 14, the respective memory gate lines 14 can be electrically connected to desired wirings 25 extending in the Y direction.

Incidentally, although the memory gate lines 14 are connected to the wirings 25 on alternate lines in the first embodiment, and the memory gate lines 14 are connected to the wirings 25 at intervals of seven lines in the present embodiment, the memory gate lines 14 can be connected to the wirings 25 at intervals of the number of lines according to need.

The present embodiment can also obtain an advantageous effect substantially similar to the first embodiment.

While the invention made above by the present inventors has been described specifically on the basis of the preferred embodiments, the present invention is not limited to the embodiments referred to above. It is needless to say that various changes can be made thereto without the scope not departing from the gist thereof. Although the split gate type memory cell using the MONOS has been explained in the present embodiment, for example, it can also be applied to a 1 transistor type NOR type flash memory or the like.

This invention is suitable for application to a semiconductor device including a nonvolatile semiconductor memory device.

What is claimed is:

1. A semiconductor device comprising:
first and second memory array forming regions including a plurality of nonvolatile memory cells, wherein each of the nonvolatile memory cells includes a charge storage layer formed over a semiconductor substrate and a memory gate formed over the charge storage layer; and
a shunt region formed between the first and second memory array forming regions, wherein the shunt region is a region for supplying voltage to the memory gates of the nonvolatile memory cells;
wherein the memory gates of the nonvolatile memory cells are extended in a first direction, respectively, and are arranged in parallel,
wherein, in the shunt region, a plurality of wirings for supplying voltage are formed over the memory gates and extended in a second direction substantially perpendicular to the first direction;
wherein, in the shunt region, a plurality of the plugs are formed between the memory gates and the wirings, wherein each of the memory gates is respectively connected to one of the wirings through one of the plugs;
wherein one of the plugs is connected to a first contact section of one of the memory gates,
wherein another one of the plugs is connected to a second contact section of another one of the memory gates, and
wherein the first and second contact sections are shifted relative to each other in the first direction.

2. A semiconductor device according to the claim 1,
wherein the nth and n+8th to n+8mth (where n and m: integers) memory gates are connected to one another by the same wiring of the wirings.

3. A semiconductor device according to the claim 1,
wherein an element isolation region is formed in the semiconductor substrate, and
wherein the first and second contact sections are arranged over the element isolation region.

4. A semiconductor device according to the claim 3,
wherein the element isolation region is formed of a second insulating film embedded into a trench formed in the semiconductor substrate.

5. A semiconductor device according to the claim 1,
wherein the memory gates are formed in sidewall form.

6. A semiconductor device according to the claim 1,
wherein each of the memory gates is comprised of a polysilicon film, respectively, and
wherein silicide films are formed over the memory gates.

7. A semiconductor device according to the claim 6,
wherein the silicide films are comprised of cobalt silicide films.

8. A semiconductor device according to the claim 1,
wherein the charge storage layers include a silicon nitride film, respectively.

9. A semiconductor device comprising:
first and second memory array forming regions including a plurality of nonvolatile memory cells, wherein each of the nonvolatile memory cells includes a control gate formed over a semiconductor substrate, a charge storage layer formed over the semiconductor substrate, and a memory gate formed over the charge storage layer and formed over a side surface of a control gate; and
a shunt region formed between the first and second memory array forming regions, wherein the shunt region is a region for supplying voltage to the memory gates of the nonvolatile memory cells;
wherein the memory gates of the nonvolatile memory cells are extended in a first direction, respectively, and are arranged in parallel,
wherein, in the shunt region, a plurality of wirings for supplying voltage are formed over the memory gates and extended in a second direction substantially perpendicular to the first direction;
wherein, in the shunt region, a plurality of the plugs are formed between the memory gates and the wirings, wherein each of the memory gates is respectively connected to one of the wirings through one of the plugs;
wherein one of the plugs is connected to a first contact section of one of the memory gates,
wherein another one of the plugs is connected to a second contact section of another one of the memory gates, and
wherein the first and second contact sections are shifted relative to each other in the first direction.

10. A semiconductor device according to the claim 9,
wherein the nth and n+8th to n+8mth (where n and m: integers) memory gates are connected to one another by the same wiring of the wirings.

11. A semiconductor device according to the claim 9,
wherein an element isolation region is formed in the semiconductor substrate, and
wherein the first and second contact sections are arranged over the element isolation region.

12. A semiconductor device according to the claim 11,
wherein the element isolation region is formed of a second insulating film embedded into a trench formed in the semiconductor substrate.

13. A semiconductor device according to the claim 9,
wherein the memory gates are formed in sidewall form.

14. A semiconductor device according to the claim 9,
wherein each of the memory gates is comprised of a poly silicon film, respectively, and
wherein silicide films are formed over the memory gates.

15. A semiconductor device according to the claim 14,
wherein the silicide films are comprised of cobalt silicide films.

16. A semiconductor device according to the claim 9,
wherein the charge storage layers include a silicon nitride film, respectively.

* * * * *